US010686255B2

(12) United States Patent
Suzuki

(10) Patent No.: US 10,686,255 B2
(45) Date of Patent: Jun. 16, 2020

(54) SHEET-TYPE METAMATERIAL AND SHEET-TYPE LENS

(71) Applicant: National University Corporation Tokyo University of Agriculture and Technology, Tokyo (JP)

(72) Inventor: Takehito Suzuki, Hitachi (JP)

(73) Assignee: National University Corporation Tokyo University of Agriculture and Technology, Tokyo (JP)

(*) Notice: Subject to any disclaimer, the term of this patent is extended or adjusted under 35 U.S.C. 154(b) by 171 days.

(21) Appl. No.: 15/749,083

(22) PCT Filed: Jul. 15, 2016

(86) PCT No.: PCT/JP2016/070978
§ 371 (c)(1),
(2) Date: Jan. 30, 2018

(87) PCT Pub. No.: WO2017/022456
PCT Pub. Date: Feb. 9, 2017

(65) Prior Publication Data
US 2018/0226724 A1    Aug. 9, 2018

(30) Foreign Application Priority Data

Aug. 5, 2015 (JP) .................................. 2015-154943

(51) Int. Cl.
*H01Q 15/04* (2006.01)
*H01P 1/00* (2006.01)
(Continued)

(52) U.S. Cl.
CPC ............. *H01Q 15/04* (2013.01); *G02B 1/007* (2013.01); *H01P 1/00* (2013.01); *H01Q 15/0086* (2013.01);
(Continued)

(58) Field of Classification Search
CPC .... H01Q 15/04; H01Q 15/14; H01Q 15/0086; H05K 1/0213; H05K 1/16; H05K 1/02; H01P 1/00; G02B 1/007
(Continued)

(56) References Cited

U.S. PATENT DOCUMENTS 8,198,953 B2 * 6/2012 Sanada .............. H01Q 15/0086
333/219
2007/0215843 A1    9/2007 Soukoulis
(Continued)

OTHER PUBLICATIONS

Office Action issued for counterpart Japanese Application No. 2015-154943, drafted by the Japan Patent Office on Jun. 5, 2019.
Extended European Search Report issued for counterpart European Application No. 16832735.1, issued by the European Patent Office dated Feb. 25, 2019.
(Continued)

*Primary Examiner* — Robert J Pascal
*Assistant Examiner* — Jorge L Salazar, Jr.

(57) ABSTRACT

A sheet-type metamaterial of a film configuration to exhibit a figure of merit (FOM) exceeding 300 in a terahertz wave band. A film-shaped dielectric substrate has a front surface on which a first wire array is formed, and a back surface on which a second wire array is formed. The first wire array includes elongated metallic first cut wires of a predetermined length l aligned in a y-axis direction with a gap g therebetween and in an x-axis direction with space s therebetween. The second wire array includes second metallic cut wires having the same shape as the first cut wires and aligned to overlap the first cut wires. With a thickness d of the dielectric substrate set at about 50 μm, the length l of the first cut wire and the second cut wire is a length approximate to a value to generate resonance at a design frequency.

6 Claims, 41 Drawing Sheets

(51) Int. Cl.
- H05K 1/16 (2006.01)
- G02B 1/00 (2006.01)
- H01Q 15/00 (2006.01)
- H01Q 15/14 (2006.01)
- H05K 1/02 (2006.01)

(52) U.S. Cl.
CPC ........... H01Q 15/14 (2013.01); H05K 1/0213 (2013.01); H05K 1/16 (2013.01); H05K 1/02 (2013.01)

(58) Field of Classification Search
USPC .......................... 333/204, 219, 238, 245, 248
See application file for complete search history.

(56) References Cited

U.S. PATENT DOCUMENTS

| | | | |
|---|---|---|---|
| 2011/0069377 A1 | 3/2011 | Wu | |
| 2013/0162375 A1* | 6/2013 | Kitaoka | H01P 7/00 333/219 |

OTHER PUBLICATIONS

Hiroki Wakatsuchi et al., "Cut-Wire Metamaterial Design Based on Simplified Equivalent Circuit Models", IEEE Transactions on Antennas and Propagation, Aug. 2012, pp. 3670-3678, vol. 60, No. 8, XP011455304, US.

Hiroshi Kubo et al., "A Sheet-Type Metamaterial with Rejection Characteristics in a Frequency Range", 2009, pp. 1223-1226, XP031613365, US.

Oyama et al., "TM Wave Rejection Characteristics of Sheet-Type Artificial materials Composed of Pairs of Metal Patterns," Institute of Electronics, Information, and Communication Engineers General Conference 2011, Transactions on Electronics 1, C-2-76, 2011, p. 114.

Kukutsu, Naoya, "Toward practical applications of THz-wave," The Institute of Electronics, Information, and Communication Engineers, IEICE Technical Report, MW2014-52, 2014, pp. 55-58.

Oct. 4, 2016 International Search Report issued in International Patent Application No. PCT/JP2016/070978.

Oct. 4, 2016 Written Opinion of the International Searching Authority issued in International Patent Application No. PCT/JP2016/070978.

* cited by examiner

| g | 85 μm |
|---|---|
| d | 50 μm |
| l | 313 μm |
| w | 46 μm |
| s | 164 μm |
| t | 0.5 μm |

Cyclo-olefin polymer
$\varepsilon r = 2.34$, $\tan \delta = 0.0016$

| | |
|---|---|
| g | 80 μm |
| d | 50 μm |
| l | 320 μm |
| w | 50 μm |
| s | 160 μm |
| t | 0.5 μm |

Fig. 17
| w | 46 μm |
|---|---|
| s | 162 μm |
| t | 0.5 μm |
| d | 50 μm |
Fig. 18
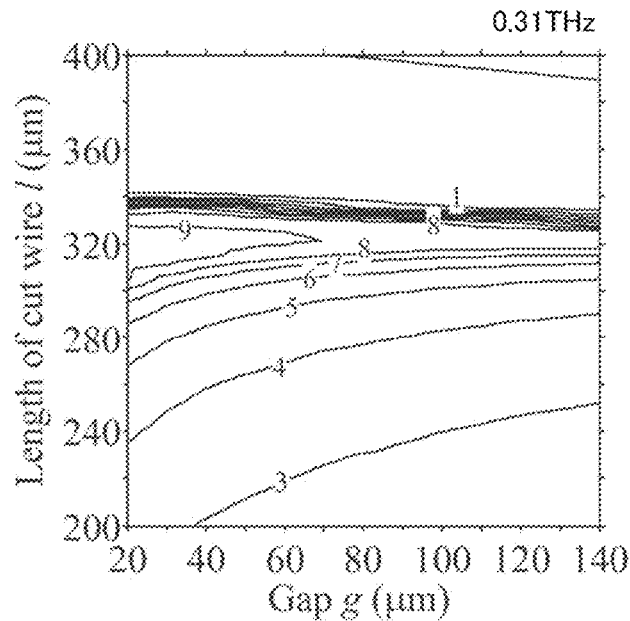
Fig. 19
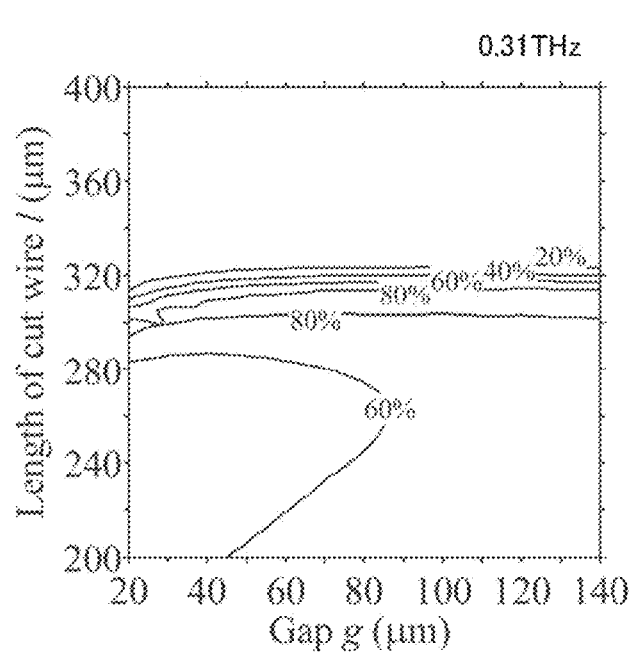

| w | 50 μm |
|---|---|
| s | 160 μm |
| t | 0.5 μm |
| d | 50 μm |

Fig. 24
| $l$ | 320 μm |
|---|---|
| $g$ | 80 μm |
| $t$ | 0.5 μm |
| $d$ | 50 μm |
Fig. 25
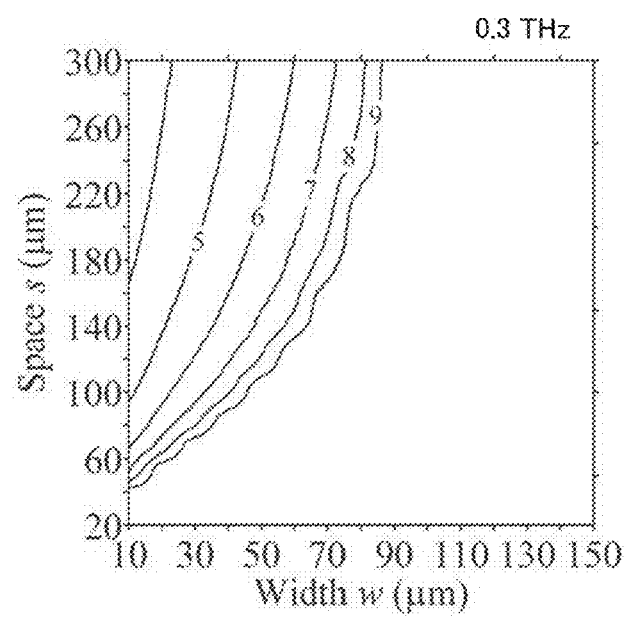
Fig. 26
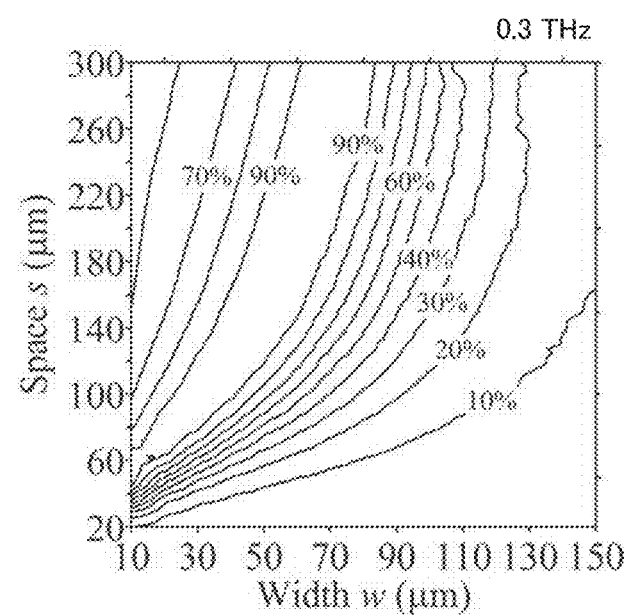

Fig. 41
| w | 10 μm |
|---|---|
| s | 32 μm |
| t | 0.5 μm |
| d | 50 μm |
Fig. 42
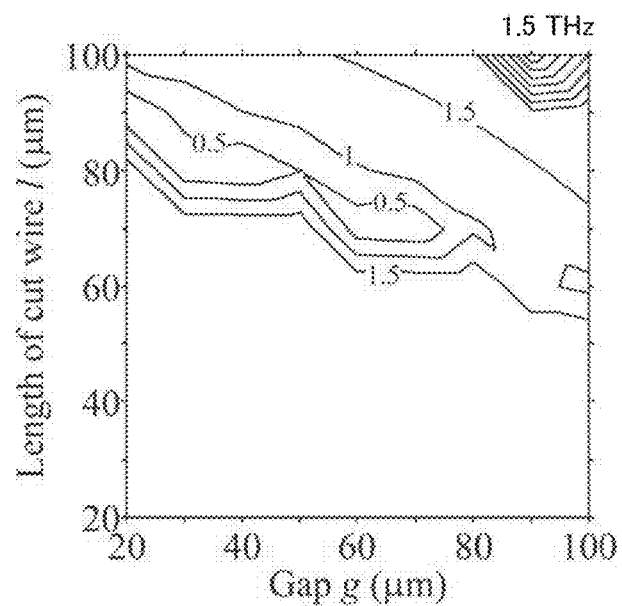
Fig. 43
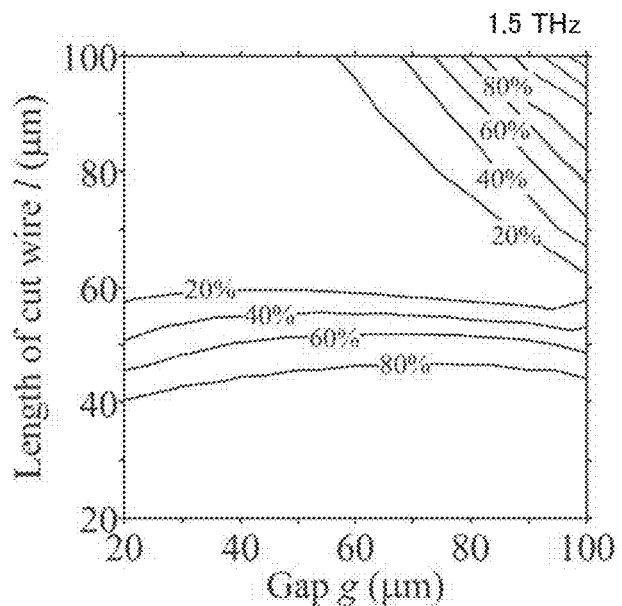

Fig. 44
| w | 7.5 μm |
|---|---|
| s | 24 μm |
| t | 0.5 μm |
| d | 50 μm |
Fig. 45
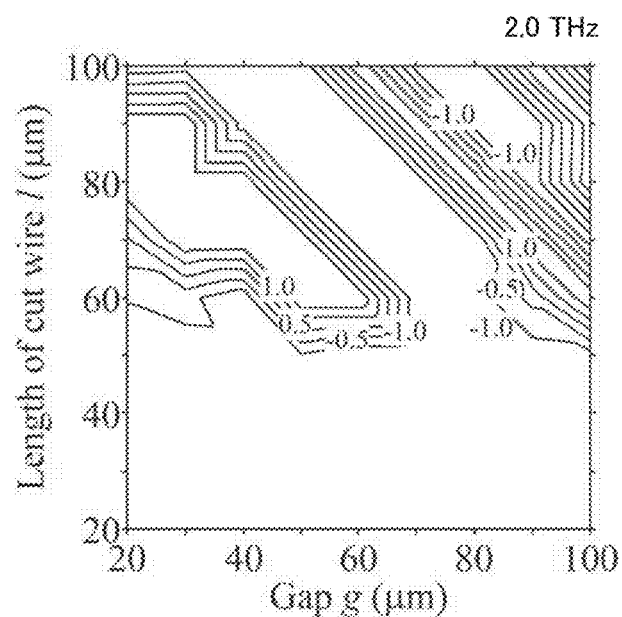
Fig. 46
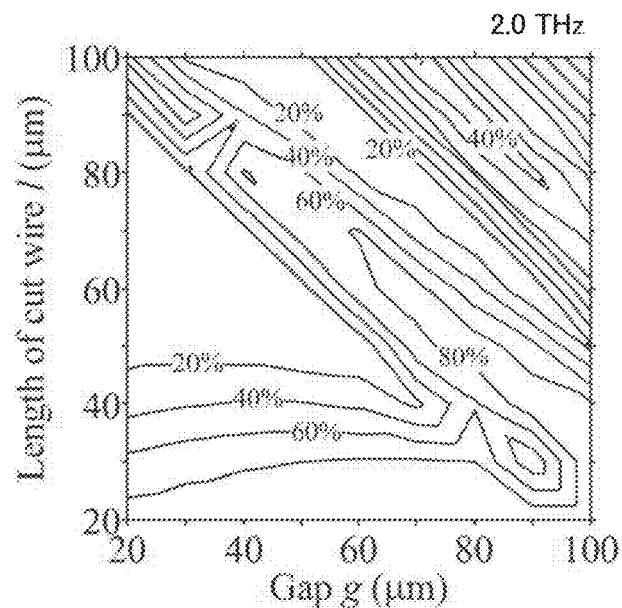

Fig. 47
| w | 5 μm |
| --- | --- |
| s | 16 μm |
| t | 0.5 μm |
| d | 50 μm |
Fig. 48
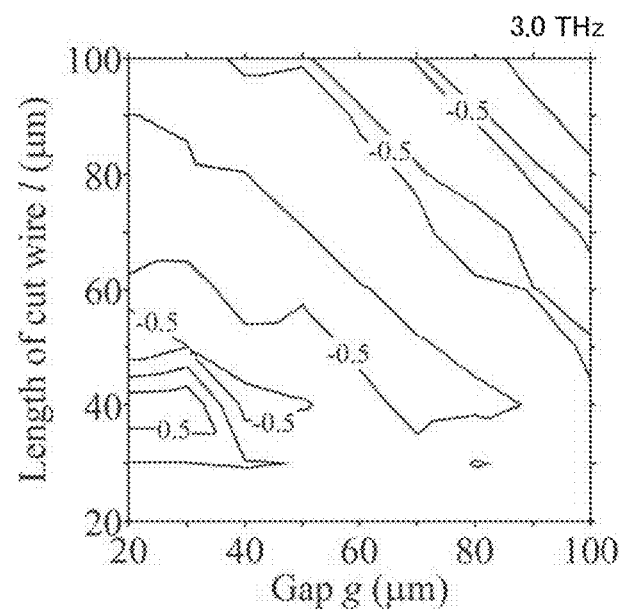
Fig. 49
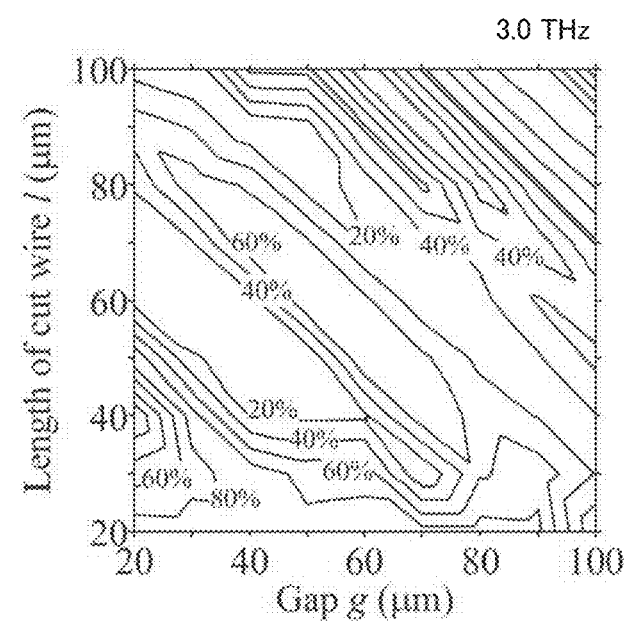

Fig. 50
| w | 50 μm |
| s | 160 μm |
| t | 0.5 μm |
| d | 23 μm |
Fig. 51
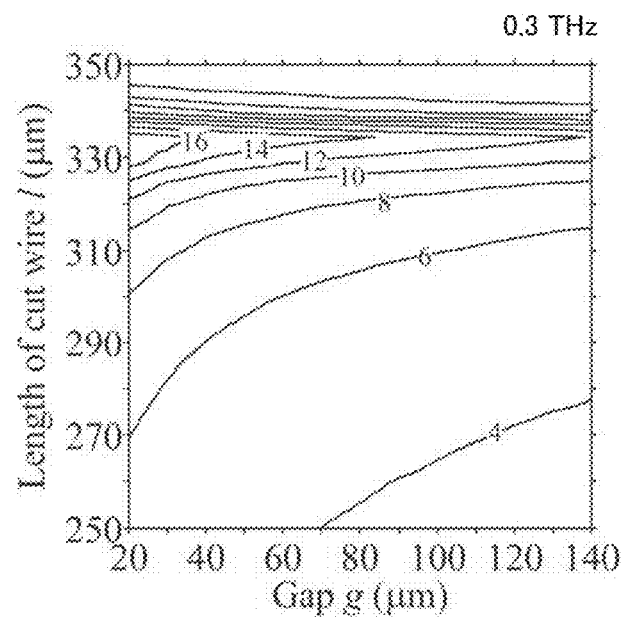
Fig. 52
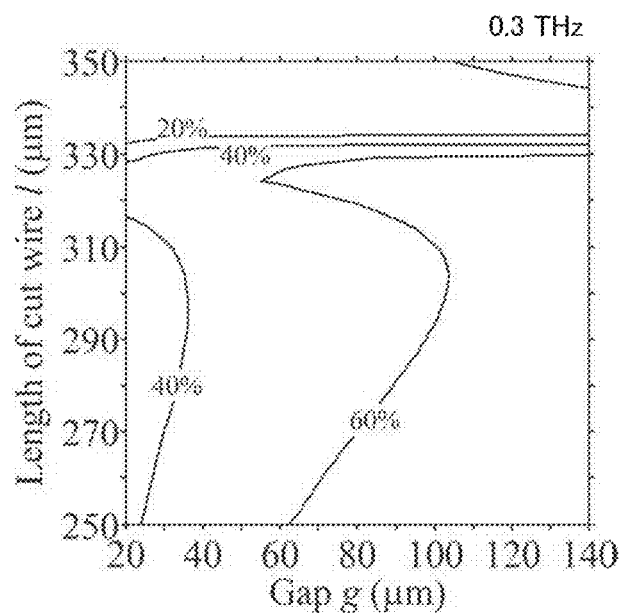

Fig. 53
| w | 50 μm |
|---|---|
| g | 80 μm |
| t | 0.5 μm |
| d | 23 μm |
Fig. 54
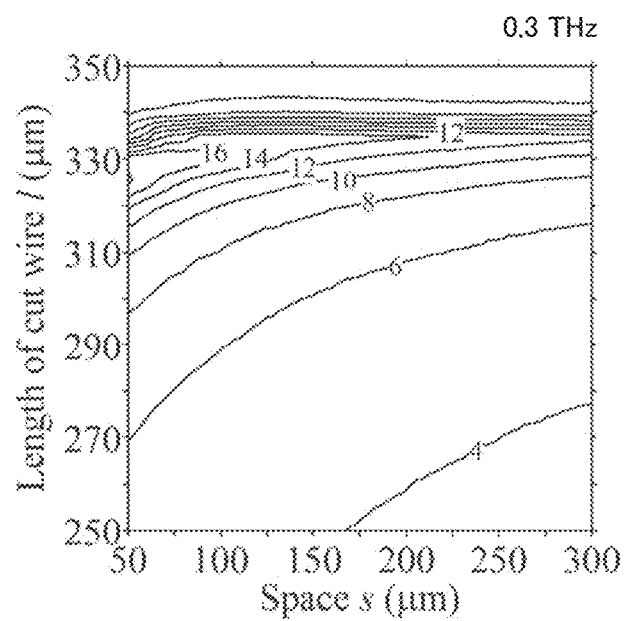
FIG. 55
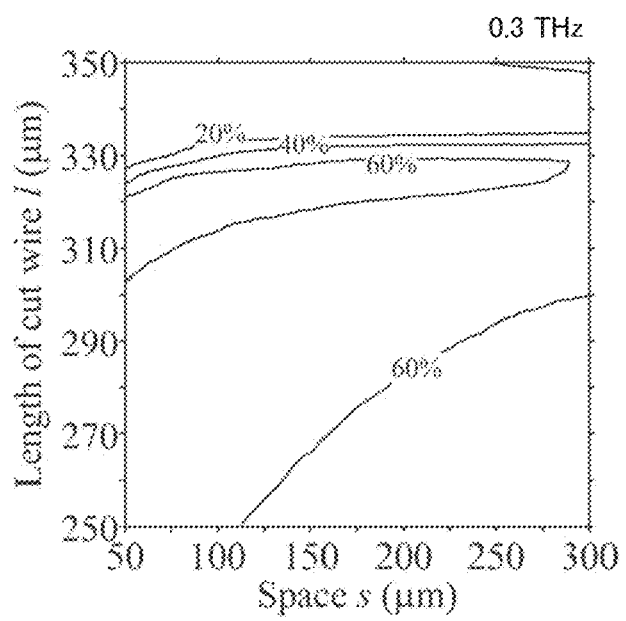

Fig. 56
| w | 50 μm |
|---|---|
| s | 160 μm |
| t | 0.5 μm |
| d | 23 μm |
Fig. 57
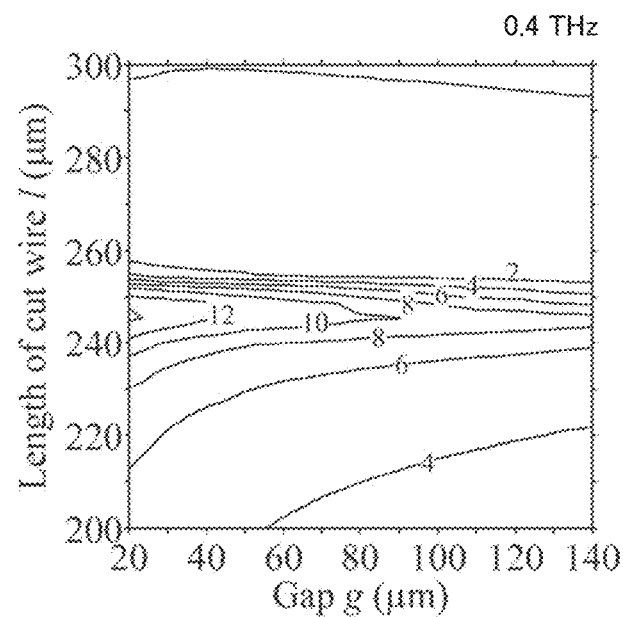
Fig. 58
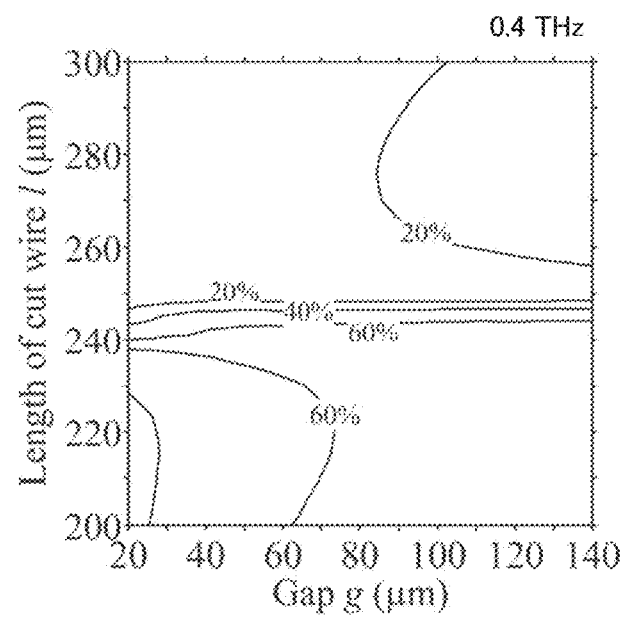

Fig. 71
| w | 10 μm |
| --- | --- |
| s | 32 μm |
| t | 0.5 μm |
| d | 23 μm |
Fig. 72
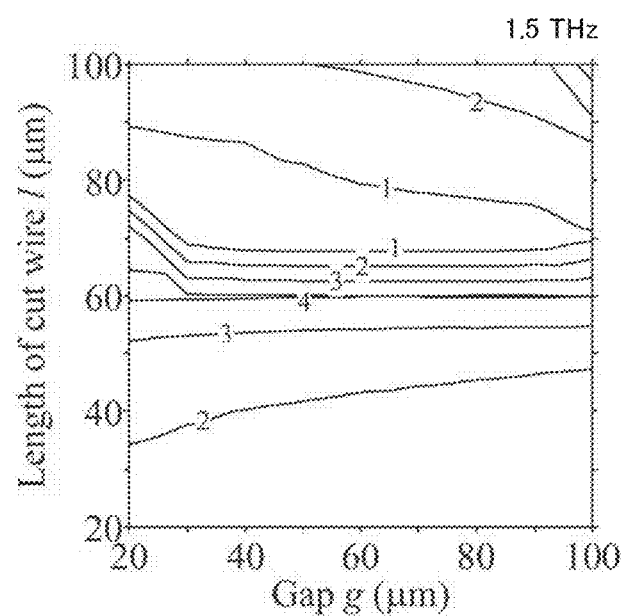
Fig. 73
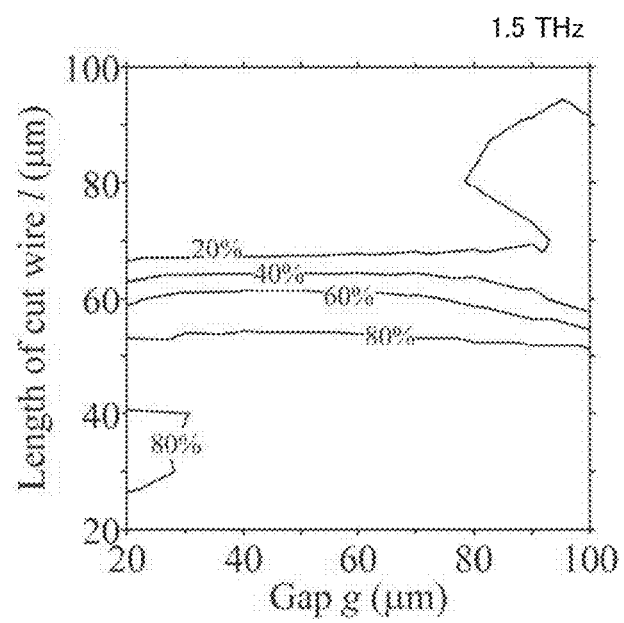

Fig. 74
| w | 7.5 μm |
|---|---|
| s | 24 μm |
| t | 0.5 μm |
| d | 23 μm |
Fig. 75
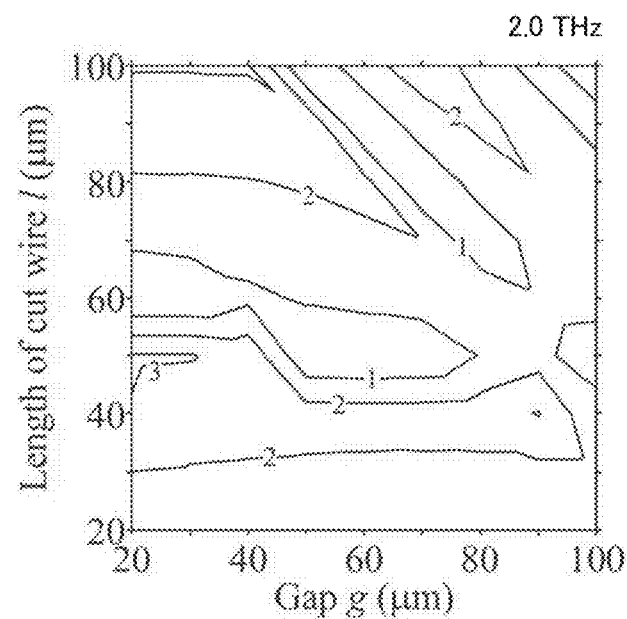
Fig. 76
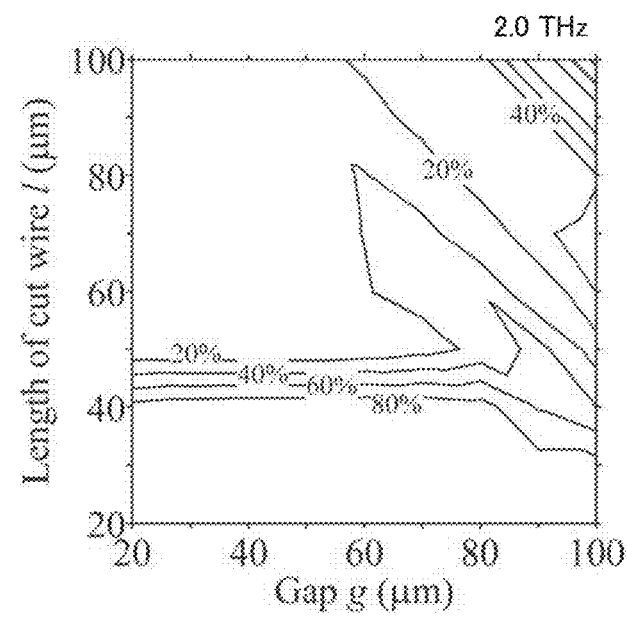

Fig. 77
| w | 5 μm |
| s | 16 μm |
| t | 0.5 μm |
| d | 23 μm |
Fig. 78
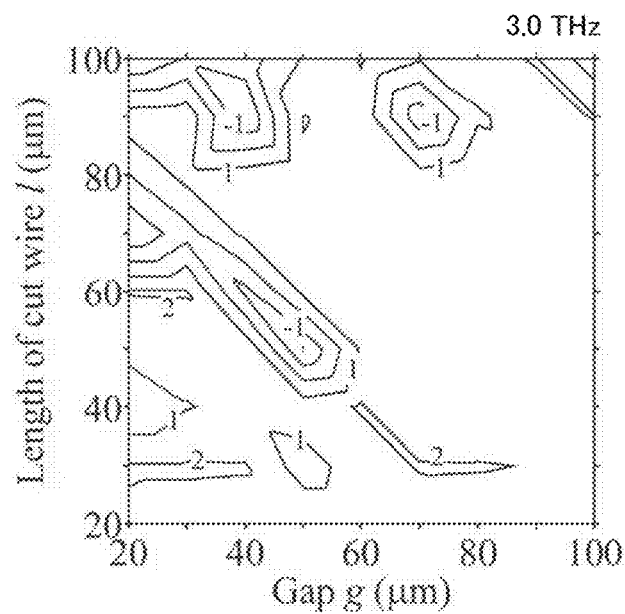
Fig. 79
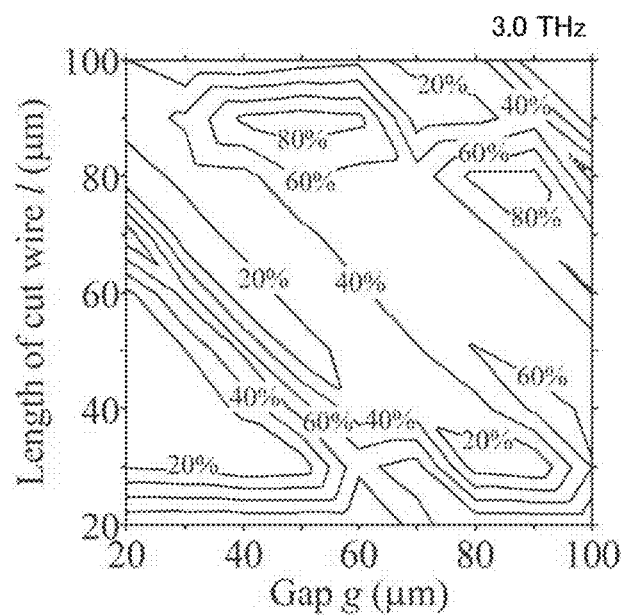

| $n_1$ | 6.92 | $P_1$ | 90.0% | $l_1$ | 320 μm | $g_1$ | 80 μm |
|---|---|---|---|---|---|---|---|
| $n_2$ | 6.58 | $P_2$ | 90.4% | $l_2$ | 320 μm | $g_2$ | 100 μm |
| $n_3$ | 5.40 | $P_3$ | 91.1% | $l_3$ | 320 μm | $g_3$ | 250 μm |
| $n_4$ | 3.42 | $P_4$ | 83.7% | $l_4$ | 305 μm | $g_4$ | 430 μm |

Focusing length f = 10mm

| $a$ | 4.8 mm |
|---|---|
| $b$ | 4.4 mm |
| $w$ | 50 μm |
| $s$ | 160 μm |
| $t$ | 0.5 μm |
| $d$ | 50 μm | depth of focus 6.3mm half width { E-plane 1.2mm
(z=4.6mm) { H-plane 1.1mm

Prior Art

SHEET-TYPE METAMATERIAL AND SHEET-TYPE LENS

TECHNICAL FIELD

This invention relates to a sheet-type metamaterial functioning as a metamaterial with a dielectric substrate and metallic cut wires arranged on opposite surfaces of the dielectric substrate, and a sheet-type lens using the sheet-type metamaterial.

BACKGROUND ART

Veselago showed that incidence of light on a medium having a permittivity and a permeability both of negative values causes negative refraction and an artificial structure producing a negative permeability and a negative permittivity has been suggested. Such an artificial structure producing a negative permeability and a negative permittivity is an aggregate of structures having a scale sufficiently larger than atoms and smaller than a light wavelength and is called a metamaterial. Using the metamaterial as a negative refractive medium allows formation of a perfect lens having a planar shape. The perfect lens overcomes diffraction limitation to allow observation of a tiny object and allows accurate reproduction of a near field (evanescent wave).

A metamaterial is applicable to a lens for a terahertz electromagnetic wave having received attention in recent years. A terahertz electromagnetic wave is an electromagnetic wave having a frequency from 0.1 to 10 THz (wavelength from 30 to 3000 μm). This wavelength is substantially the same as a range from the wavelength of a far-infrared wave to that of a millimeter wave. The terahertz electromagnetic wave exists in a frequency range between the frequency of "light" and that of a "millimeter wave." Thus, the terahertz electromagnetic wave has both an ability to identify an object with a spatial resolution as high as that of light and an ability comparable to that of a millimeter wave to pass through a substance. An electromagnetic wave in the terahertz wave band has not been explored so far. Meanwhile, application for example to characterization of a material has been examined that is to be achieved by time-domain spectroscopy, imaging, and tomography utilizing the characteristics of the electromagnetic wave in this frequency band. The terahertz electromagnetic wave has both the performance of passing through a substance and straightness. Thus, generating the terahertz electromagnetic wave instead of an X-ray allows safe and innovative imaging or ultrahigh-speed radio communication of some hundreds of Gbps.

In particular, terahertz imaging is one of quite attractive visualization techniques to take the place of an X ray for realizing safety, security, and high precision. Terahertz imaging has been reported to achieve terahertz nano-imaging in a near field overcoming diffraction limitation or reported to obtain a resolution of 400 nm (one wavelength divided by 540) at 1.4 THz. Terahertz imaging has also been reported to achieve imaging at 0.3 THz using a resonant tunneling diode. Using a metamaterial allows design of a negative refractive index n of −1 and is expected to achieve a flat perfect lens overcoming diffraction limitation by restoring near field light to become an evanescent component at a separate location.

A conventional sheet-type metamaterial 100 shown in FIG. 89 has been suggested (see non-patent literature 1). This sheet-type metamaterial 100 has a configuration like a flat plate formed by aligning a large number of unit cells 101 in a matrix periodically. As shown in a partial enlarged view of FIG. 89, the unit cell 101 includes a dielectric substrate 110 placed in an x-y plane. The dielectric substrate 110 has a front surface on which a front surface metal strip 111 of an elongated rectangular shape is formed to extend in an x-axis direction, and a back surface on which a back surface metal strip 112 of an elongated rectangular shape is formed so as to overlap the front surface metal strip 111. If a plane wave polarized in the x-axis direction enters the sheet-type metamaterial 100, flux linkage is generated between the front surface metal strip 111 and the back surface metal strip 112 formed on the opposite surfaces of the dielectric substrate 110. This causes a flow of a circulating current to make the front surface metal strip 111 and the back surface metal strip 112 function as a magnetic particle. In particular, an equivalent permeability takes a negative value at a resonant frequency of the front surface metal strip 111 and the back surface metal strip 112 or more. Further, polarization is generated by the application of an electric field E to make the front surface metal strip 111 and the back surface metal strip 112 function as a dielectric particle. In particular, resonance occurs between particles aligned in the x-axis direction at a given frequency and an equivalent permittivity takes a large positive value at a frequency not exceeding the given frequency. This generates a single-negative region between these resonant frequencies to attenuate the incident wave. A frequency rejection band in a given range can be obtained by selecting the dimensions or positions of the front surface metal strip 111 and the back surface metal strip 112 and adjusting the two resonant frequencies. For example, a frequency rejection band from about 4.5 to about 5.5 GHz can be obtained by setting dimensions as follows about the unit cell 101: a relative permittivity cr of the dielectric substrate 110 at 10.2, a breadth a, a height b, and a thickness c of the unit cell 101 at 15.2 mm, 12.7 mm, and 1.6 mm respectively, a length h and a width w of the front surface metal strip 111 and the back surface metal strip 112 at 12.1 mm and 0.6 mm respectively.

PRIOR ART LITERATURE

Non-Patent Literature

Non-patent literature 1: "TM Wave Rejection Characteristics of Sheet-Type Artificial Materials Composed of Pairs of Metal Patterns," written by three members including Yohei OYAMA, The Institute of Electronics, Information and Communication Engineers general conference 2011, Transactions on Electronics 1, C-2-76

SUMMARY OF INVENTION

Problem to be Solved by Invention

A metamaterial to be applied to a resonant tunneling diode, for example, is required to have an ability to provide a planar lens having a high refractive index and sharp directivity in a terahertz wave band. However, such a metamaterial has yet to be developed.

It is an object of this invention to provide a sheet-type metamaterial of a film configuration to exhibit a figure of merit (FOM) exceeding 300 that has not conventionally been achieved in a terahertz wave band, and a sheet-type lens of a planar shape using the sheet-type metamaterial.

Solution to Problem

To achieve the above-described object, a sheet-type metamaterial of this invention is a sheet-type metamaterial to operate in a terahertz wave band. The sheet-type metamaterial is most principally characterized in that the sheet-type metamaterial comprises: a film-shaped dielectric substrate; a first wire array formed on one surface of the dielectric substrate; and a second wire array formed on an opposite surface of the dielectric substrate. The first wire array includes elongated metallic first cut wires of a predetermined length l aligned in a direction of a y-axis of the dielectric substrate with a gap g therebetween and in an x-axis direction perpendicular to the y-axis with space s therebetween. The second wire array includes second metallic cut wires having the same shape as the first cut wires and aligned so as to overlap the first cut wires. The length l of the first cut wires and the second cut wires is set in a range from about 20 to about 320 μm.

In the sheet-type metamaterial of this invention, with a wavelength λ at a usable frequency, the length l of the first cut wires and the second cut wires is about λ/2. Further, with a design frequency set in a range from 0.3 to 0.9 THz, a higher refractive index can be obtained by setting the space s at about 160 μm and reducing the thickness d from about 50 μm to about 23 μm.

In the sheet-type metamaterial of this invention, with a design frequency set in a range from 1.0 to 3.0 THz, a higher refractive index can be obtained by reducing the space s from about 46 to about 5 μm with frequency increase and by reducing the thickness d from about 50 μm to about 23 μm.

A sheet-type lens of this invention is a sheet-type lens comprising a large number of unit cells aligned on a film-shaped dielectric substrate. The sheet-type lens is most principally characterized in that the unit cells each include an elongated metallic first cut wire of a predetermined length l formed on one surface of the dielectric substrate, and a second metallic cut wire having the same shape as the first cut wire and formed on an opposite surface of the dielectric substrate so as to overlap the first cut wire. The first cut wires of the unit cells are aligned on the one surface of the dielectric substrate in an x-axis direction with a gap g therebetween and in a y-axis direction perpendicular to the x-axis direction with space s therebetween. The second cut wires of the unit cells are aligned on the opposite surface of the dielectric substrate in the x-axis direction with the gap g therebetween and in the y-axis direction perpendicular to the x-axis direction with the space s therebetween. The first cut wire and the second cut wire each have a long axis extending substantially parallel to the x-axis direction. The dielectric substrate has a region divided into n regions from a central part to an outer edge of the dielectric substrate. Each region except an innermost region and an outermost region surrounds a region inside this region and is surrounded by a region external to this region. A refractive index is reduced with an increasing distance from an inner region toward an outer region.

In the sheet-type lens of this invention, a refractive index may be reduced with an increasing distance from the inner region toward the outer region by increasing the gap g with an increasing distance from the inner region toward the outer region.

In the sheet-type lens of this invention, with a thickness d of the dielectric substrate set at about 50 μm, the length l of the first cut wire and the second cut wire may be a length approximate to a value to generate resonance at a design frequency.

Advantageous Effect of Invention

This invention is capable of providing a sheet-type metamaterial of a film configuration to exhibit an FOM exceeding 300 that has not conventionally been achieved in a terahertz wave band. A sheet-type lens using the sheet-type metamaterial of this invention functions as a planar lens having sharp directivity.

BRIEF DESCRIPTION OF DRAWINGS

FIG. 17 is a table showing different exemplary dimensions of the unit cell in the sheet-type metamaterial according to the embodiment of this invention.

FIG. 18 is a contour chart of a refractive index at 0.31 THz with parameters including a gap g and a length l about the unit cell in the sheet-type metamaterial according to this invention.

FIG. 19 is a contour chart of transmission power at 0.31 THz with parameters including the gap g and the length l about the unit cell in the sheet-type metamaterial according to this invention.

FIG. 24 is a table showing different exemplary dimensions of the unit cell in the sheet-type metamaterial according to the embodiment of this invention.

FIG. 25 is a contour chart of a refractive index at 0.3 THz with parameters including a width w and space s about the unit cell in the sheet-type metamaterial according to this invention.

FIG. 26 is a contour chart of transmission power at 0.3 THz with parameters including the width w and the space s about the unit cell in the sheet-type metamaterial according to this invention.

FIG. 41 is a table showing different exemplary dimensions of the unit cell in the sheet-type metamaterial according to this invention.

FIG. 42 is a contour chart of a refractive index at 1.5 THz with parameters including the gap g and the length l about the unit cell in the sheet-type metamaterial according to this invention.

FIG. 43 is a contour chart of transmission power at 1.5 THz with parameters including the gap g and the length l about the unit cell in the sheet-type metamaterial according to this invention.

FIG. 44 is a table showing different exemplary dimensions of the unit cell in the sheet-type metamaterial according to the embodiment of this invention.

FIG. 45 is a contour chart of a refractive index at 2.0 THz with parameters including the gap g and the length l about the unit cell in the sheet-type metamaterial according to this invention.

FIG. 46 is a contour chart of transmission power at 2.0 THz with parameters including the gap g and the length l about the unit cell in the sheet-type metamaterial according to this invention.

FIG. 47 is a table showing different exemplary dimensions of the unit cell in the sheet-type metamaterial according to the embodiment of this invention.

FIG. 48 is a contour chart of a refractive index at 3.0 THz with parameters including the gap g and the length l about the unit cell in the sheet-type metamaterial according to this invention.

FIG. 49 is a contour chart of transmission power at 3.0 THz with parameters including the gap g and the length l about the unit cell in the sheet-type metamaterial according to this invention.

FIG. 50 is a table showing different exemplary dimensions of the unit cell in the sheet-type metamaterial according to the embodiment of this invention.

FIG. 51 is a contour chart of a refractive index at 0.3 THz with parameters including the gap g and the length l about the unit cell in the sheet-type metamaterial according to this invention.

FIG. 52 is a contour chart of transmission power at 0.3 THz with parameters including the gap g and the length l about the unit cell in the sheet-type metamaterial according to this invention.

FIG. 53 is a table showing different exemplary dimensions of the unit cell in the sheet-type metamaterial according to the embodiment of this invention.

FIG. 54 is a contour chart of a refractive index at 0.3 THz with parameters including the space s and the length l about the unit cell in the sheet-type metamaterial according to this invention.

FIG. 55 is a contour chart of transmission power at 0.3 THz with parameters including the space s and the length l about the unit cell in the sheet-type metamaterial according to this invention.

FIG. 56 is a table showing different exemplary dimensions of the unit cell in the sheet-type metamaterial according to the embodiment of this invention.

FIG. 57 is a contour chart of a refractive index at 0.4 THz with parameters including the gap g and the length l about the unit cell in the sheet-type metamaterial according to this invention.

FIG. 58 is a contour chart of transmission power at 0.4 THz with parameters including the gap g and the length l about the unit cell in the sheet-type metamaterial according to this invention.

FIG. 71 is a table showing different exemplary dimensions of the unit cell in the sheet-type metamaterial according to the embodiment of this invention.

FIG. 72 is a contour chart of a refractive index at 1.5 THz with parameters including the gap g and the length l about the unit cell in the sheet-type metamaterial according to this invention.

FIG. 73 is a contour chart of transmission power at 1.5 THz with parameters including the gap g and the length l about the unit cell in the sheet-type metamaterial according to this invention.

FIG. 74 is a table showing different exemplary dimensions of the unit cell in the sheet-type metamaterial according to the embodiment of this invention.

FIG. 75 is a contour chart of a refractive index at 2.0 THz with parameters including the gap g and the length l about the unit cell in the sheet-type metamaterial according to this invention.

FIG. 76 is a contour chart of transmission power at 2.0 THz with parameters including the gap g and the length l about the unit cell in the sheet-type metamaterial according to this invention.

FIG. 77 is a table showing different exemplary dimensions of the unit cell in the sheet-type metamaterial according to the embodiment of this invention.

FIG. 78 is a contour chart of a refractive index at 3.0 THz with parameters including the gap g and the length l about the unit cell in the sheet-type metamaterial according to this invention.

FIG. 79 is a contour chart of transmission power at 3.0 THz with parameters including the gap g and the length l about the unit cell in the sheet-type metamaterial according to this invention.

EMBODIMENTS FOR CARRYING OUT INVENTION

Figure 1:
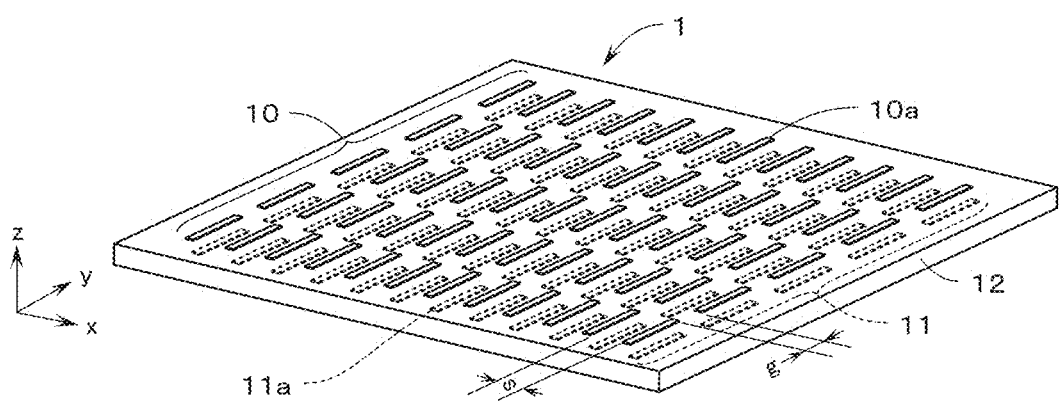
FIG. 1 is a perspective view showing the configuration of a sheet-type metamaterial according to an embodiment of this invention.
Figure 2:
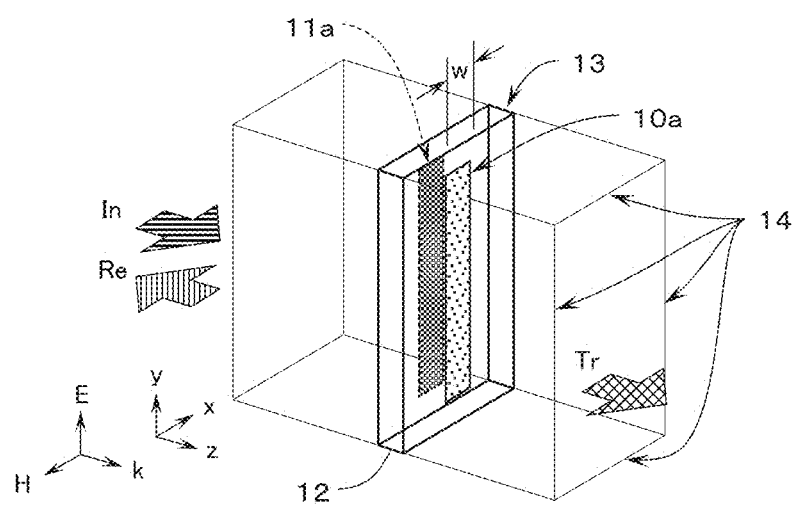
FIG. 2 is a perspective view showing the configuration of a unit cell with a periodic boundary wall in the sheet-type metamaterial according to the embodiment of this invention.
Figure 3A:
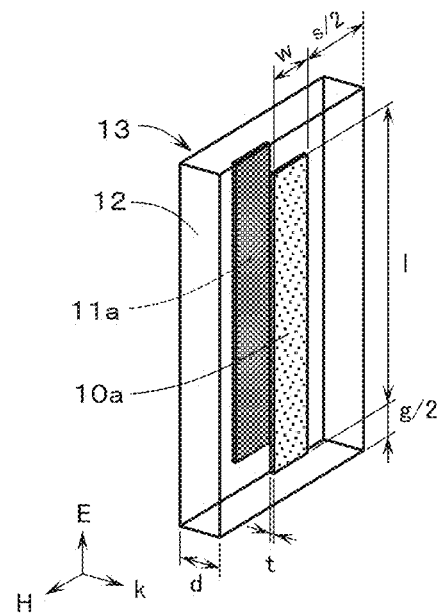
FIG. 3A is a perspective view showing the configuration of the unit cell in the sheet-type metamaterial according to the embodiment of this invention.
Figure 3B:
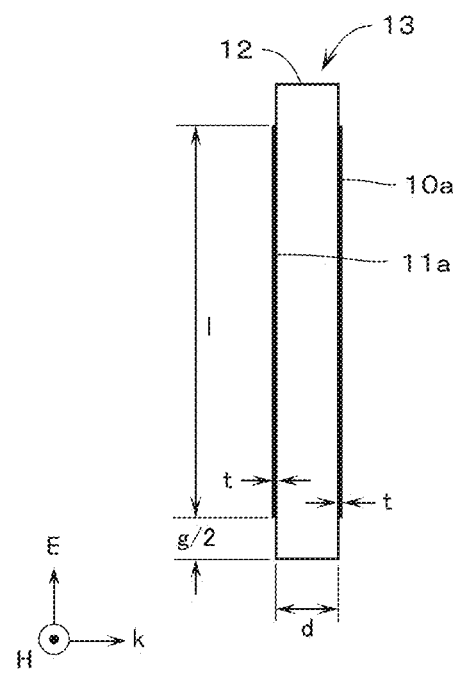
FIG. 3B is a side view showing the configuration of the unit cell in the sheet-type metamaterial according to the embodiment of this invention.

FIG. 1 is a perspective view showing the configuration of a sheet-type metamaterial 1 according to an embodiment of this invention. FIG. 2 is a perspective view showing the configuration of a unit cell 13 with a periodic boundary wall corresponding to the configuration of one period of the sheet-type metamaterial 1 according to the embodiment of this invention. FIG. 3A is a perspective view showing the configuration of the unit cell 13 in detail. FIG. 3B is a side view of the configuration of the unit cell 13.

The sheet-type metamaterial 1 according to the embodiment of this invention shown in these drawings operates in a terahertz wave band. As shown in FIGS. 1, 2, 3A, and 3B, the sheet-type metamaterial 1 includes a rectangular dielectric substrate 12 made of a flexible film placed in an x-y plane. The dielectric substrate 12 has a front surface on which a large number of first cut wires 10a each having an elongated rectangular shape are aligned at predetermined intervals in a y-axis direction and an x-axis direction, and a back surface on which a large number of second cut wires 11a each having the same elongated rectangular shape as the first cut wires 10a are aligned at predetermined intervals so as to overlap the first cut wires 10a. In this case, the first cut wires 10a and the second cut wires 11a extend lengthwise in a direction parallel to the y axis and are arranged in a matrix to be parallel to each other.

A large number of rectangular first cut wires 10a extending in an elongated shape in the y-axis direction and having a length l are formed to be arranged on the front surface of the dielectric substrate 12 in such a manner that the first cut wires 10a are aligned in the y-axis direction with a gap g therebetween and with the respective center axes agreeing with each other, and are aligned to be parallel to each other in the x-axis direction with space s therebetween. Multiple first cut wires 10a are formed on the front surface of the dielectric substrate 12 in a matrix with the gap g and the space s to form a first wire array 10. A large number of elongated rectangular second cut wires 11a having the length l are formed on the back surface of the dielectric substrate 12 so as to overlap the first cut wires 10a in such a manner that the second cut wires 11a are aligned in the y-axis direction with the gap g therebetween and with the respective center axes agreeing with each other, and are aligned to be parallel to each other in the x-axis direction with the space s therebetween. Multiple second cut wires 11a are formed on the back surface of the dielectric substrate 12 in a matrix with the gap g and the space s to form a second wire array 11. As described above, the long axis of each of the first cut wire 10a and the second cut wire 11a extends substantially parallel to the y-axis direction. For example, the dielectric substrate 12 is made of a cycloolefin polymer film having a relative permittivity of about 2.34 and low-loss characteristics expressed by tan δ of about 0.0016. The dielectric substrate 12 may be a different low-loss dielectric film.

The sheet-type metamaterial 1 according to this invention having the above-described configuration is equivalent to a configuration with a large number of unit cells 13 shown in FIGS. 2, 3A, and 3B arranged at predetermined intervals in a matrix. As shown in FIGS. 2, 3A, and 3B, the first cut wire 10a and the second cut wire 11a each have a width w and the length l. In the unit cell 13, the rectangular dielectric substrate 12 has a breadth determined by adding the space s to the width w, a vertical length determined by adding the gap g to the length l, and a thickness d. The first cut wire 10a and the second cut wire 11a are each formed, for example, by etching a metallic film formed on the dielectric substrate 12 to a thickness t.

The unit cell 13 is arranged in the x-y plane and surrounded by a periodic boundary wall 14, as shown in FIG. 2. An incident wave In in a terahertz wave band polarized in the y-axis direction enters through the periodic boundary wall 14. A reflected component of the incident wave In becomes a reflected wave Re and a transmitted component of the incident wave In becomes a transmitted wave Tr. The incident wave In has an electric field component E acting in the y-axis direction and a magnetic field component H acting in the x-axis direction. The incident wave In travels in a direction k agreeing with a z-axis direction. Then, flux linkage is generated to cause a flow of a current in an opposite direction between the first cut wire 10a and the second cut wire 11a to make the first cut wire 10a and the second cut wire 11a function a magnetic particle. In particular, a resonant frequency determined based on the length l of the first cut wire 10a and the second cut wire 11a or a frequency higher than the resonant frequency generates a frequency band where an equivalent permeability takes a negative value. Further, polarization is generated on the first cut wire 10a and the second cut wire 11a by the application of the electric field E acting in the y-axis direction to make the first cut wire 10a and the second cut wire 11a further function as a dielectric particle. In particular, a resonant frequency determined based on the length l of the first cut wire 10a and the second cut wire 11a or a frequency higher than the resonant frequency generates a frequency band where an equivalent permittivity takes a negative value.

In a configuration like that of the unit cell 13 shown in FIG. 2 where the first cut wires 10a and the second cut wires 11a on the front surface and the back surface of the dielectric substrate 12 overlap each other, a resonant frequency indicating dielectric properties is known to be higher than a resonant frequency indicating magnetic properties. By contrast, in the sheet-type metamaterial 1 according to this invention, the resonant frequency indicating magnetic properties can be increased to become substantially the same as the resonant frequency indicating dielectric properties, as described later. One of possible reasons for this is that the resonant frequency indicating dielectric properties is reduced by increase in a capacitance between the first cut wires 10a and the second cut wires 11a facing each other across the dielectric substrate 12. Metal having favorable conductivity such as gold, silver, copper, or aluminum is applicable as a metallic material for forming the first cut wires 10a and the second cut wires 11a.

Figures 4, 5:
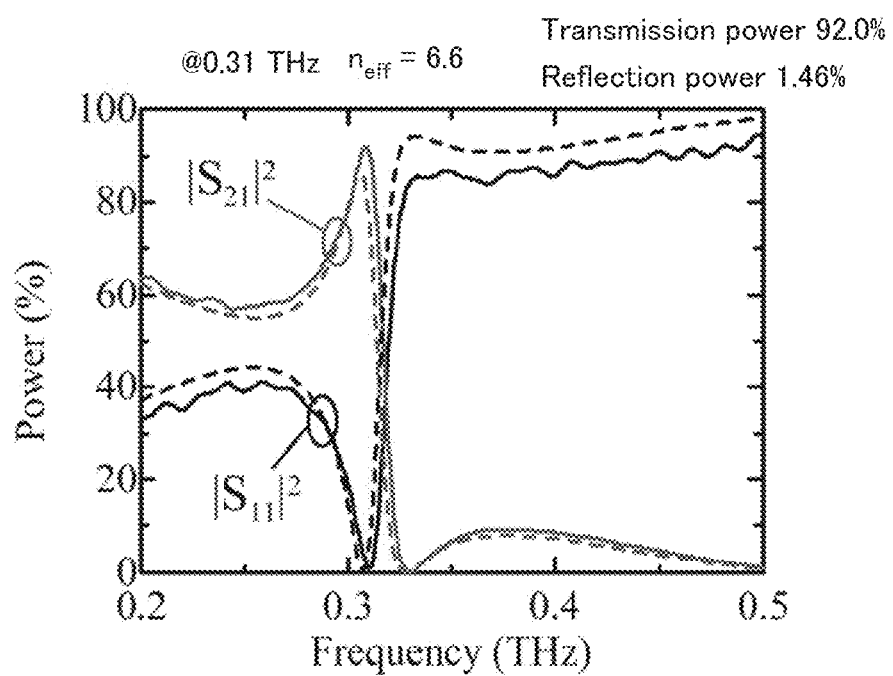
FIG. 4 is a table showing exemplary dimensions of the unit cell in the sheet-type metamaterial according to the embodiment of this invention.
FIG. 5 is a graph showing the frequency response of transmission power and that of reflection power in the sheet-type metamaterial according to this invention.

FIG. 4 shows exemplary dimensions of the unit cell 13 with a design frequency set at 0.31 THz. According to the exemplary dimensions of the unit cell 13 shown in FIG. 4, the gap g between the first cut wires 10a and between the second cut wires 11a in the y-axis direction is set at about 85

µm, the thickness d of the dielectric substrate 12 at about 50 µm, the length l of the first cut wire 10a and the second cut wire 11a at about 313 µm, the width w of the first cut wire 10a and the second cut wire 11a at about 46 µm, the space s between the first cut wires 10a and between the second cut wires 11a in the x-axis direction at about 164 µm, and the thickness t of the first cut wire 10a and the second cut wire 11a at about 0.5 µm. In the sheet-type metamaterial 1 according to this invention, the dimension of each part of the unit cell 13 is adjusted, and dimensions including the thickness d of the dielectric substrate 12 are controlled within their operating ranges. In this case, the dielectric substrate 12 made of a flexible cycloolefin polymer film has a relative permittivity of about 2.34 and tan δ of about 0.0016. A wavelength shortening ratio at the dielectric substrate 1 is about 0.654. This shows that, while one wavelength (λ) at the design frequency of 0.31 THz is about 967.7 this wavelength is shortened to about 633 µm on the dielectric substrate 12. The length l of the first cut wire 10a and the second cut wire 11a is set at a length to generate resonance, which is about λ/2.

FIGS. 5 to 10 show analysis results and experimental results obtained about the electrical characteristics of the unit cell 13 having the dimensions shown in FIG. 4 in the sheet-type metamaterial 1 according to this invention. In FIGS. 5 to 10, the experimental results are indicated by solid lines and the analysis results are indicated by dashed lines. The analysis was conducted by using a high-frequency three-dimensional electromagnetic field simulator HFSS. The analysis was conducted on condition that the first cut wire 10a and the second cut wire 11a are made of perfect conductors. As a result of the analysis on the unit cell 13 having the dimensions shown in FIG. 4, a refractive index neff obtained at 0.31 THz is a high refractive index of about 6.6 and transmission power obtained at this frequency is about 92.0%. The reflected wave Re has reflection power of about 1.46%.

FIG. 5 shows the frequency response of transmission power and that of reflection power in a frequency band from 0.2 to 0.5 THz. By referring to FIG. 5, the experimental results show that transmission power $|S_{22}|^2$ is about 62% at 0.2 THz, decreases slightly with frequency increase, and then increases steeply to a maximum of about 92% at about 0.31 THz. With subsequent frequency increase, the transmission power $|S_{21}|^2$ decreases steeply to substantially 0% at about 0.33 THz. The transmission power $|S_{21}|^2$ increases gently with subsequent frequency increase and then decreases to about 2% at 0.5 THz. The analysis results substantially agree with the experimental results in a range up to about 0.32 THz. In a range exceeding this frequency, the analysis results exhibit slightly larger values than those of the experimental results.

By referring to FIG. 5, the experimental results show that reflection power $|S_{11}|^2$ is about 33% at 0.2 THz, increases slightly with frequency increase, and then decreases steeply to a minimum of about 1.46% at about 0.31 THz. With subsequent frequency increase, the reflection power $|S_{11}|^2$ increases steeply to about 86% at about 0.33 THz. The reflection power $|S_{11}|^2$ increases gently with subsequent frequency increase to about 95% at 0.5 THz. The analysis results substantially agree with the experimental results.

Figure 6:
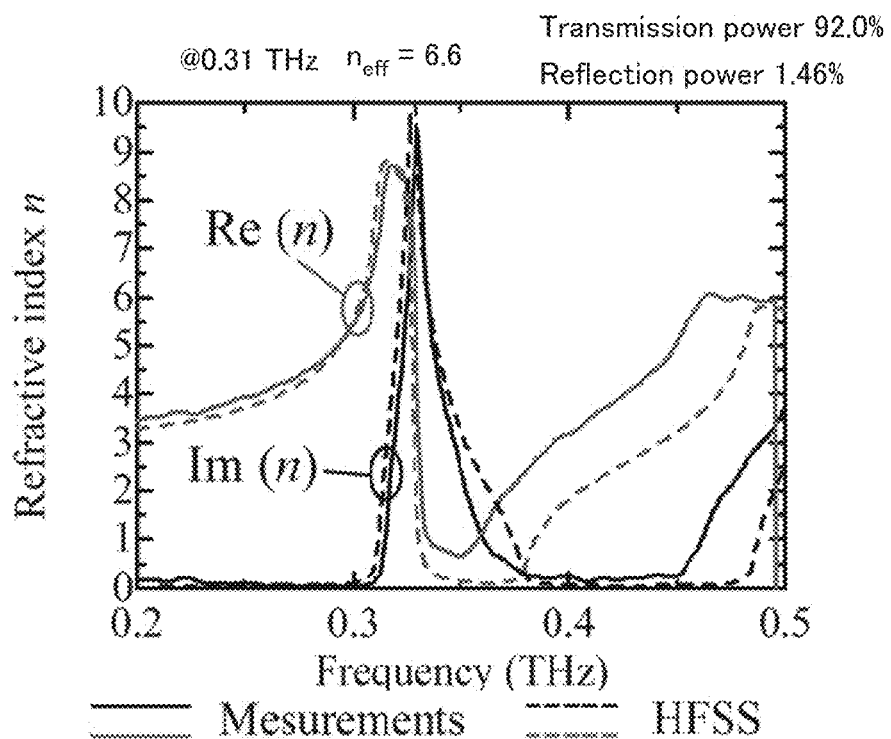
FIG. 6 is a graph showing the frequency response of a refractive index in the sheet-type metamaterial according to this invention.

FIG. 6 shows the frequency response of a complex refractive index in a frequency band from 0.2 to 0.5 THz. By referring to FIG. 6, the experimental results show that a real part Re (n) of the complex refractive index is about 3.5 at 0.2 THz and then increases with frequency increase to a maximum of about 8.8 at about 0.31 THz. With subsequent frequency increase, the real part Re(n) decreases steeply to about 0.6 at about 0.35 THz. With subsequent frequency increase, the real part Re(n) increases to about 6.0 at 0.5 THz. The analysis results substantially agree with the experimental results in a range up to about 0.32 THz. In a range exceeding this frequency, the analysis results exhibit slightly smaller values than those of the experimental results.

By referring to FIG. 6, the experimental results show that an imaginary part Im(n) of the complex refractive index is about 0.1 in a range from 0.2 to 0.31 THz and increases steeply from a frequency exceeding 0.31 THz to a maximum of about 9.5 at about 0.32 THz. With subsequent frequency increase, the imaginary part Im(n) decreases steeply to about 0.4 at about 0.39 THz. The imaginary part Im(n) maintains a value in a range up to about 0.45 THz and then increases with frequency increase to about 3.7 at 0.5 THz. The analysis results substantially agree with the experimental results.

As understood from FIGS. 5 and 6, the unit cell 13 according to this invention is capable of obtaining a high refractive index of about 6.6 and high transmission power of about 92.0% at a frequency of about 0.31 THz.

Figure 7:
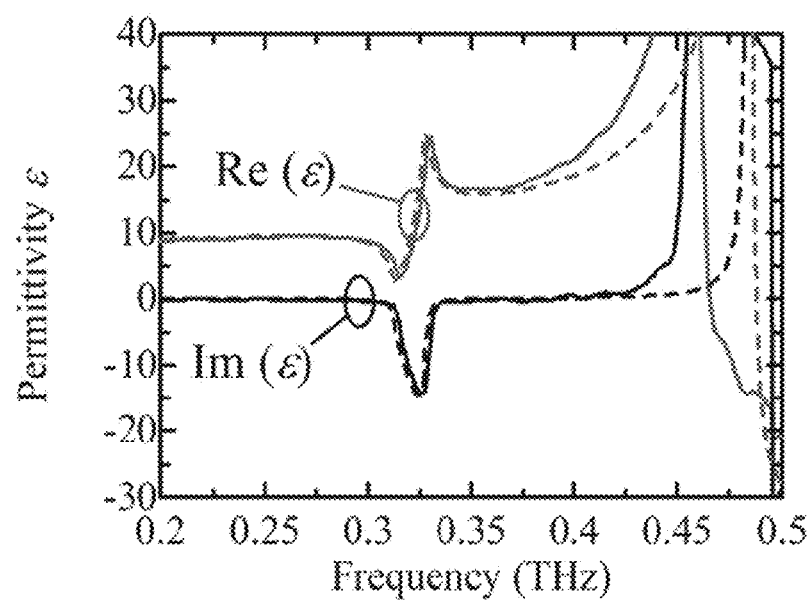
FIG. 7 is a graph showing the frequency response of a permittivity in the sheet-type metamaterial according to this invention.

FIG. 7 shows the frequency response of a complex permittivity (Permittivity) of the unit cell 13 in a frequency band from 0.2 to 0.5 THz. By referring to FIG. 7, the experimental results show that a real part Re(ε) of the complex permittivity c is about 9.5 in a range from 0.2 to about 0.3 THz. The real part Re(ε) decreases once with frequency increase and then increases steeply to a maximum of about 25 at about 0.325 THz. With subsequent frequency increase, the real part Re(ε) decreases to about 17 and then increases from a frequency exceeding about 0.375 THz to a value exceeding 40 at about 0.43 THz. The analysis results substantially agree with the experimental results in a range from about 0.2 to about 0.375 THz. In a range exceeding this upper frequency, the analysis results exhibit slightly smaller values than those of the experimental results.

By referring to FIG. 7, the experimental results show that an imaginary part Im(ε) of the complex permittivity c is substantially zero in a range from 0.2 to 0.32 THz and decreases steeply with frequency increase from about 0.32 THz to a minimum of about −15 at about 0.325 THz. With subsequent frequency increase, the imaginary part Im(ε) increases steeply to substantially zero at about 0.33 THz. The analysis results substantially agree with the experimental results in a range from about 0.2 to about 0.425 THz.

Figure 8:
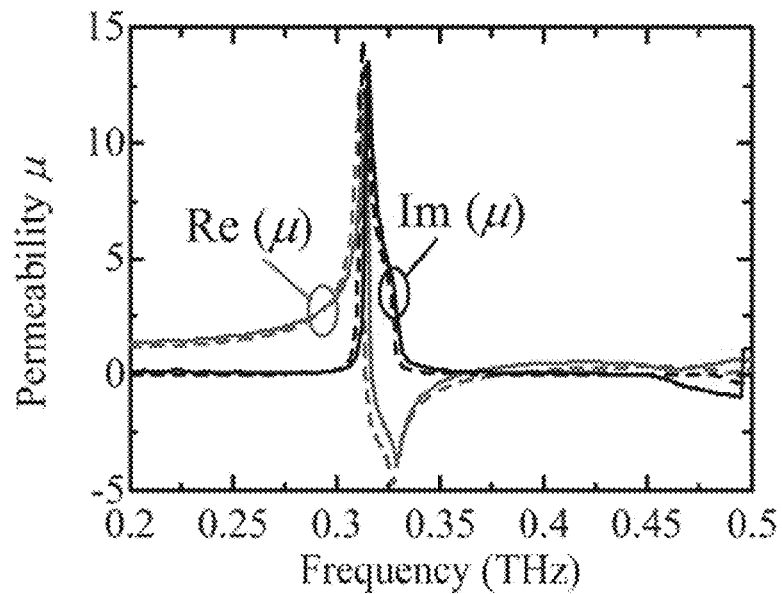
FIG. 8 is a graph showing the frequency response of a permeability in the sheet-type metamaterial according to this invention.

FIG. 8 shows the frequency response of a complex permeability (Permeability) µ of the unit cell 13 in a frequency band from 0.2 to 0.5 THz. By referring to FIG. 8, the experimental results show that a real part Re(µ) of the complex permeability µ is about three at about 0.2 THz. The real part Re(µ) increases gently with frequency increase and increases steeply from a frequency exceeding about 0.3 THz to a maximum of about 17 at about 0.31 THz. With subsequent frequency increase, the real part Re(µ) decreases steeply to about −8 at about 0.375 THz. With subsequent frequency increase, the real part Re(µ) increases to substantially zero at about 0.36 THz and maintains a value of substantially zero in a range up to 0.5 THz. The analysis results substantially agree with the experimental results.

By referring to FIG. 8, the experimental results show that an imaginary part Im(µ) of the complex permeability µ is substantially zero in a range from 0.2 to about 0.3 THz and increases steeply from a frequency exceeding about 0.3 THz to a maximum of about 15 at about 0.31 THz. With subsequent frequency increase, the imaginary part Im(µ)

decreases steeply to substantially zero at about 0.335 THz and maintains a value of substantially zero even with subsequent frequency increase to 0.5 THz. The analysis results substantially agree with the experimental results.

Figure 9:
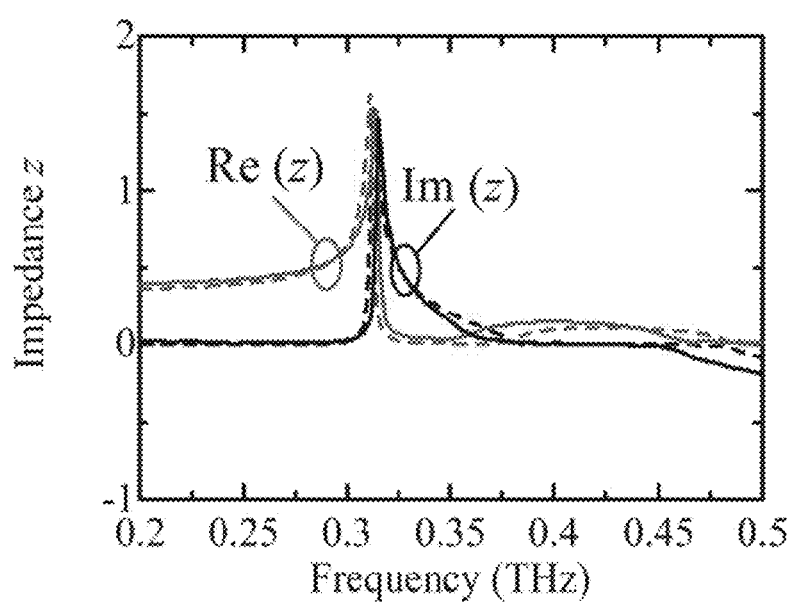
FIG. 9 is a graph showing the frequency response of an impedance in the sheet-type metamaterial according to this invention.

FIG. 9 shows the frequency response of a complex impedance (Impedance) z of the unit cell 13 in a frequency band from 0.2 to 0.5 THz. By referring to FIG. 9, the experimental results show that a real part Re(z) of the complex impedance z is about 0.4 at 0.2 THz. The real part Re(z) increases gently with frequency increase and increases steeply from a frequency exceeding about 0.3 THz to a maximum of about 1.5 at about 0.31 THz. With subsequent frequency increase, the real part Re(z) decreases steeply to substantially zero at about 0.32 THz. With subsequent frequency increase, the real part Re(z) increases and decreases slightly while maintaining its value of substantially zero in a range up to 0.5 THz. The analysis results substantially agree with the experimental results.

By referring to FIG. 9, the experimental results show that an imaginary part Im(z) of the complex impedance z is substantially zero in a range from 0.2 to about 0.3 THz and increases steeply from a frequency exceeding about 0.3 THz to a maximum of about 1.6 at about 0.31 THz. With subsequent frequency increase, the imaginary part Im(z) decreases steeply to substantially zero at about 0.36 THz. The imaginary part IM(z) maintains a value of substantially zero even with subsequent frequency increase to 0.5 THz. The analysis results substantially agree with the experimental results.

Figures 10, 11:
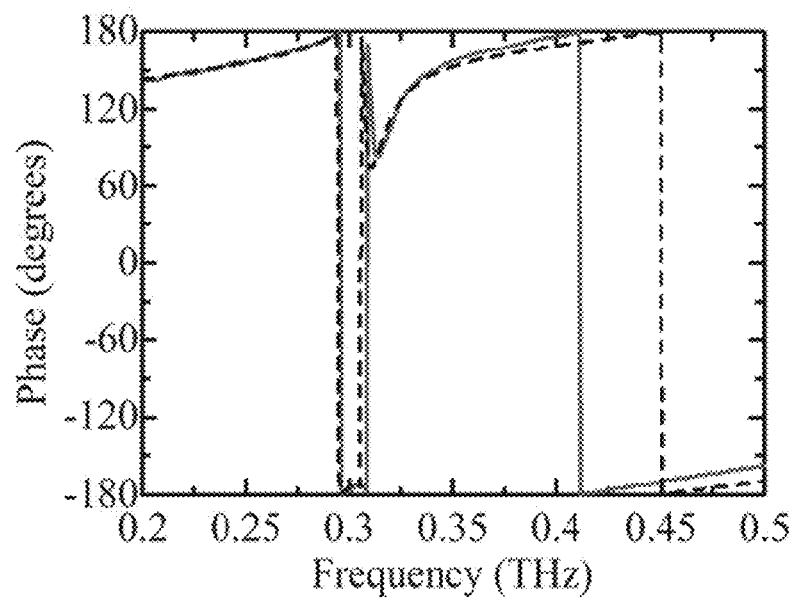
FIG. 10 is a graph showing the frequency response of a phase in the sheet-type metamaterial according to this invention.
FIG. 11 is a table showing different exemplary dimensions of the unit cell in the sheet-type metamaterial according to the embodiment of this invention.

FIG. 10 shows the frequency response of a phase (Phase) of the unit cell 13 in a frequency band from 0.2 to 0.5 THz. By referring to FIG. 10, the experimental results show that the phase is about 140° (degrees) at about 0.2 THz. The phase increases gently with frequency increase to about 180° at about 0.295 THz. The phase is inverted at this frequency to about −180°. The phase is substantially −180° in a range from about 0.295 to about 0.305 THz and is inverted again at about 0.305 THz to about 180°. At a frequency exceeding about 0.305 THz, the phase decreases steeply to about 90°. Then, the phase increases to reach about 180° at about 0.41 THz and is inverted further at this frequency to −180°. With subsequent frequency increase, the phase increases gently to about −160° at 0.5 THz. The analysis results substantially agree with the experimental results.

As understood from the analysis results and the experimental results obtained about the electrical characteristics of the unit cell 13 shown in FIGS. 5 to 10, the unit cell 13 having the dimensions shown in FIG. 4 resonates at frequencies around 0.3 THz.

FIG. 11 shows different exemplary dimensions of the unit cell 13 with a design frequency set at 0.3 THz. According to the exemplary dimensions of the unit cell 13 shown in FIG. 11, the gap g between the first cut wires 10a and between the second cut wires 11a in the y-axis direction is set at about 80 μm, the thickness d of the dielectric substrate 12 at about 50 μm, the length l of the first cut wire 10a and the second cut wire 11a at about 320 μm, the width w of the first cut wire 10a and the second cut wire 11a at about 50 μm, the space s between the first cut wires 10a and between the second cut wires 11a in the x-axis direction at about 160 μm, and the thickness t of the first cut wire 10a and the second cut wire 11a at about 0.5 μm. In the sheet-type metamaterial 1 according to this invention, the dimension of each part of the unit cell 13 is adjusted, and dimensions including the thickness d of the dielectric substrate 12 are controlled within their operating ranges. In this case, the dielectric substrate 12 made of the flexible cycloolefin polymer film has a relative permittivity of about 2.34 and tan δ of about 0.0016. A wavelength shortening ratio at the dielectric substrate 12 is about 0.654. This shows that, while one wavelength (λ) at the design frequency of 0.3 THz is about 1000 μm, this wavelength is shortened to about 654 μm on the dielectric substrate 12. The length l is set at a length to generate resonance, which is about λ/2.

FIGS. 12 to 16 show analysis results obtained about the electrical characteristics of the unit cell 13 having the dimensions shown in FIG. 11 in the sheet-type metamaterial 1 according to this invention. The analysis was conducted by using the high-frequency three-dimensional electromagnetic field simulator HFSS. The analysis was conducted on condition that the first cut wire 10a and the second cut wire 11a are made of perfect conductors. As a result of the analysis on the unit cell 13 having the dimensions shown in FIG. 11, the refractive index neff obtained at 0.30 THz is a high refractive index of about 7.14 and transmission power obtained at this frequency is about 98.5%.

Figure 12:
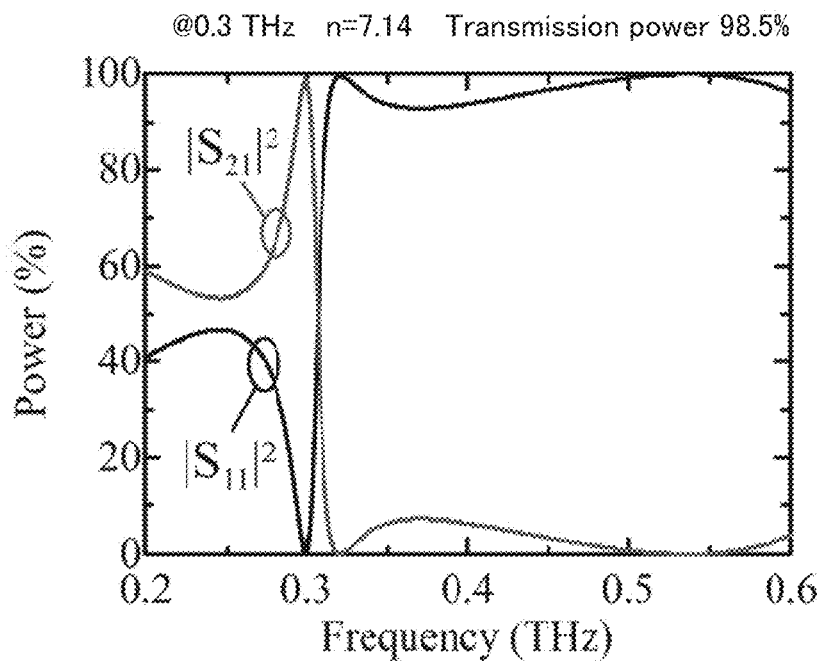
FIG. 12 shows the frequency response of transmission power and that of reflection power in the unit cell in the sheet-type metamaterial according to this invention.

FIG. 12 shows the frequency response of transmission power and that of reflection power in a frequency band from 0.2 to 0.6 THz. By referring to FIG. 12, the analysis results show that the transmission power $|S_{21}|^2$ is about 59% at 0.2 THz, decreases slightly with frequency increase, and then increases steeply to a maximum of about 98.5% at about 0.30 THz. With subsequent frequency increase, the transmission power $|S_{21}|^2$ decreases steeply to substantially 0% at about 0.315 THz. The transmission power $|S_{21}|^2$ increases gently with subsequent frequency increase and then decreases to about 3% at 0.6 THz.

By referring to FIG. 12, the analysis results show that the reflection power $|S_{11}|^2$ is about 41% at 0.2 THz, increases slightly with frequency increase, and then decreases steeply to a minimum of about 1.5% at about 0.30 THz. With subsequent frequency increase, the reflection power $|S_{11}|^2$ increases steeply to substantially 100% at about 0.315 THz. The reflection power $|S_{11}|^2$ decreases and increases gently with subsequent frequency increase to about 97% at 0.6 THz.

Figure 13:
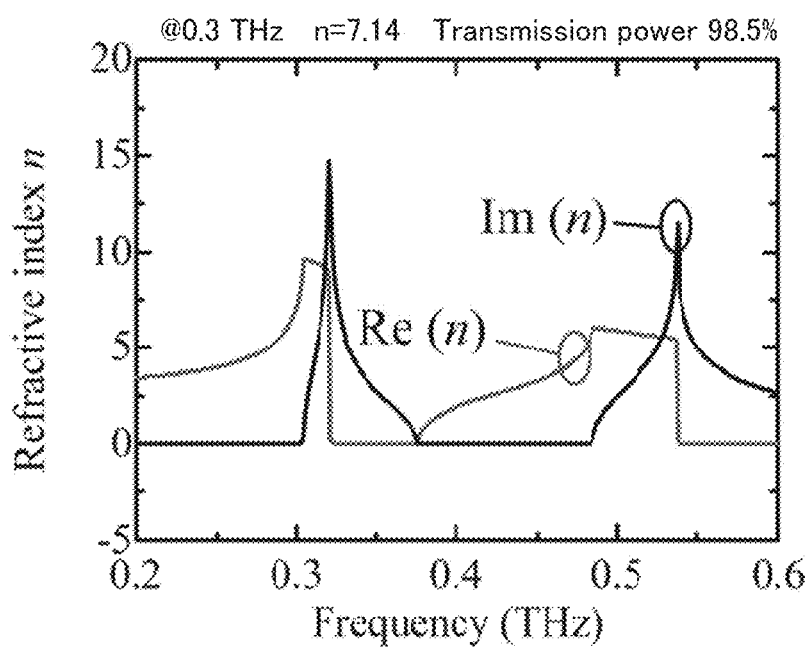
FIG. 13 shows the frequency response of a refractive index in the unit cell in the sheet-type metamaterial according to this invention.

FIG. 13 shows the frequency response of a complex refractive index n in a frequency band from 0.2 to 0.6 THz. By referring to FIG. 13, the analysis results show that the real part Re(n) of the complex refractive index is about three at 0.2 THz and then increases with frequency increase to a maximum of about 10 at about 0.30 THz. With subsequent frequency increase, the real part Re(n) decreases steeply to substantially zero at about 0.31 THz. When a frequency exceeds about 0.375 THz thereafter, the real part Re(n) increases gradually to about seven in a range from about 0.48 to about 0.54 THz. The real part Re(n) decreases to substantially zero at about 0.54 THz and maintains a value of substantially zero in a range up to 0.6 THz.

By referring to FIG. 13, the analysis results show that the imaginary part Im(n) of the complex refractive index is substantially zero in a range from 0.2 to 0.3 THz and increases steeply from a frequency exceeding 0.3 THz to a maximum of about 15 at about 0.31 THz. With subsequent frequency increase, the imaginary part Im(n) decreases steeply to substantially zero at about 0.375 THz. The imaginary part Im(n) maintains a value of substantially zero in a range up to about 0.48 THz and then increases with frequency increase to about 13 at 0.54 THz. Then, the imaginary part Im(n) decreases steeply to about 2.5 at 0.6 THz.

As understood from FIGS. 12 and 13, the unit cell 13 according to this invention having the dimensions shown in FIG. 11 is capable of obtaining a high refractive index of about 7.14 and high transmission power of about 98.5% at a frequency of about 0.30 THz. Specifically, the sheet-type metamaterial 1 of this invention is capable of providing a flexible, flat, and thin lens available in a terahertz wave band.

Figure 14:
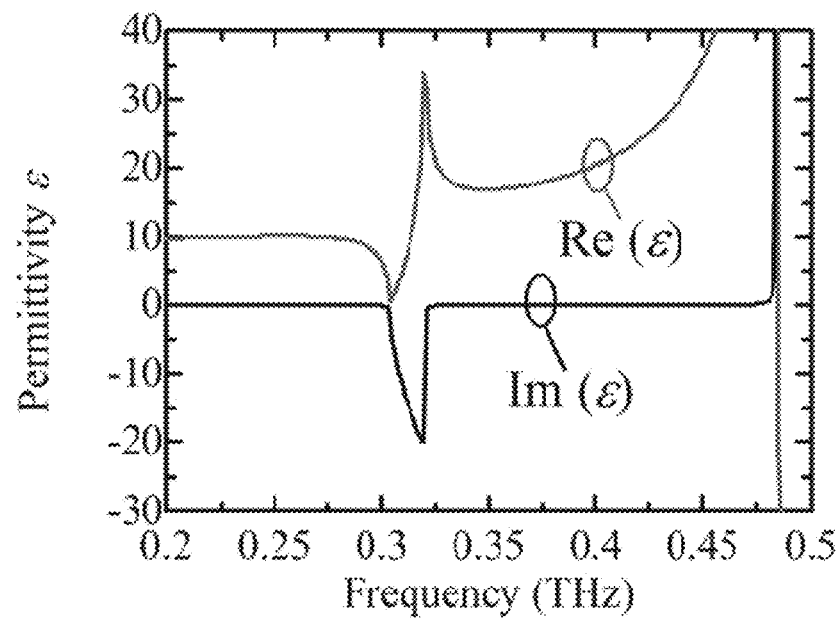
FIG. 14 shows the frequency response of a permittivity in the unit cell in the sheet-type metamaterial according to this invention.

FIG. 14 shows the frequency response of the complex permittivity (Permittivity) ε of the unit cell 13 in a frequency band from 0.2 to 0.5 THz. By referring to FIG. 14, the analysis results show that the real part Re(ε) of the complex permittivity c is about 10 in a range from 0.2 to about 0.29 THz. The real part Re(ε) decreases steeply from a frequency exceeding about 0.29 THz to substantially zero at about 0.3 THz. Then, the real part Re(ε) increases steeply to about 34 at about 0.32 THz. With subsequent frequency increase, the real part Re(ε) decreases steeply to about 17 and then increases from a frequency exceeding about 0.35 THz to a value exceeding 40 at about 0.46 THz.

By referring to FIG. 14, the analysis results show that the imaginary part Im(ε) of the complex permittivity c is substantially zero in a range from 0.2 to about 0.30 THz and decreases steeply with frequency increase from about 0.30 THz to a minimum of about −20 at about 0.32 THz. With subsequent frequency increase, the imaginary part Im(ε) increases steeply to substantially zero at a frequency slightly higher than about 0.32 THz.

Figure 15:
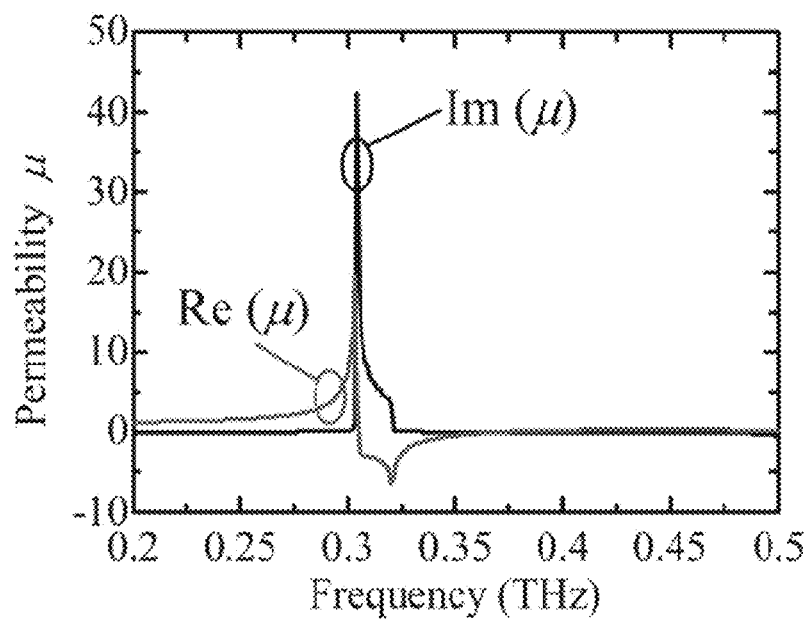
FIG. 15 shows the frequency response of a permeability in the unit cell in the sheet-type metamaterial according to this invention.

FIG. 15 shows the frequency response of the complex permeability (Permeability) μ of the unit cell 13 in a frequency band from 0.2 to 0.5 THz. By referring to FIG. 15, the analysis results show that the real part Re(μ) of the complex permeability μ is about one in a range from 0.2 to about 0.29 THz. The real part Re(μ) increases steeply from a frequency exceeding about 0.29 THz to a maximum of about 20 at a frequency slightly higher than about 0.3 THz. With subsequent frequency increase, the real part Re(μ) decreases steeply to about −3 at about 0.31 THz and then about −6 at about 0.32 THz. With subsequent frequency increase, the real part Re(μ) increases to substantially zero at about 0.36 THz and maintains a value of substantially zero in a range up to 0.5 THz.

By referring to FIG. 15, the imaginary part Im(μ) of the complex permeability μ is substantially zero in a range from 0.2 to about 0.3 THz and increases steeply from a frequency exceeding about 0.3 THz to a maximum of about 42 at a frequency slightly higher than about 0.3 THz. With subsequent frequency increase, the imaginary part Im(μ) decreases steeply to substantially zero at about 0.32 THz and maintains a value of substantially zero even with subsequent frequency increase to 0.5 THz.

Figure 16:
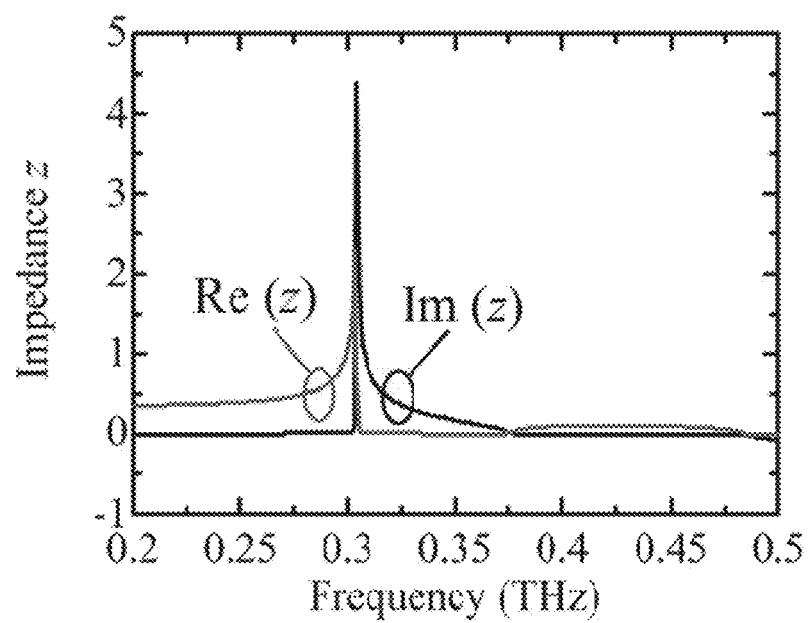
FIG. 16 shows the frequency response of an impedance in the unit cell in the sheet-type metamaterial according to this invention.

FIG. 16 shows the frequency response of the complex impedance (Impedance) z of the unit cell 13 in a frequency band from 0.2 to 0.5 THz. By referring to FIG. 16, the analysis results show that the real part Re(z) of the complex impedance z is about 0.4 in a range from 0.2 to about 0.29 THz. The real part Re(z) increases steeply from a frequency exceeding about 0.29 THz to a maximum of about 2.5 at a frequency slightly higher than about 0.3 THz. Even with subsequent slight frequency increase, the real part Re(z) decreases steeply to substantially zero. With subsequent frequency increase, the real part Re(z) increases and decreases slightly while maintaining its value of substantially zero in a range up to 0.5 THz.

By referring to FIG. 16, the imaginary part Im(z) of the complex impedance z is substantially zero in a range from 0.2 to about 0.3 THz and increases steeply from a frequency exceeding about 0.3 THz to a maximum of about 4.4 at a frequency slightly higher than about 0.3 THz. With subsequent frequency increase, the imaginary part Im(z) decreases steeply to substantially zero at about 0.375 THz. The imaginary part IM(z) maintains a value of substantially zero with subsequent frequency increase to 0.5 THz.

FIG. 17 shows different exemplary dimensions of the unit cell 13 with a design frequency set at 0.31 THz. According to the exemplary dimensions of the unit cell 13 shown in FIG. 17, the width w of the first cut wire 10a and the second cut wire 11a is set at about 46 μm, the space s between the first cut wires 10a and between the second cut wires 11a in the x-axis direction at about 162 μm, the thickness t of the first cut wire 10a and the second cut wire 11a at about 0.5 μm, and the thickness d of the dielectric substrate 12 at about 50 μm. The dielectric substrate 12 has a relative permittivity (about 2.34) and tan δ (about 0.0016) same as those described above. Unless specified otherwise, these values are applied to the description below.

Figures 20, 21:
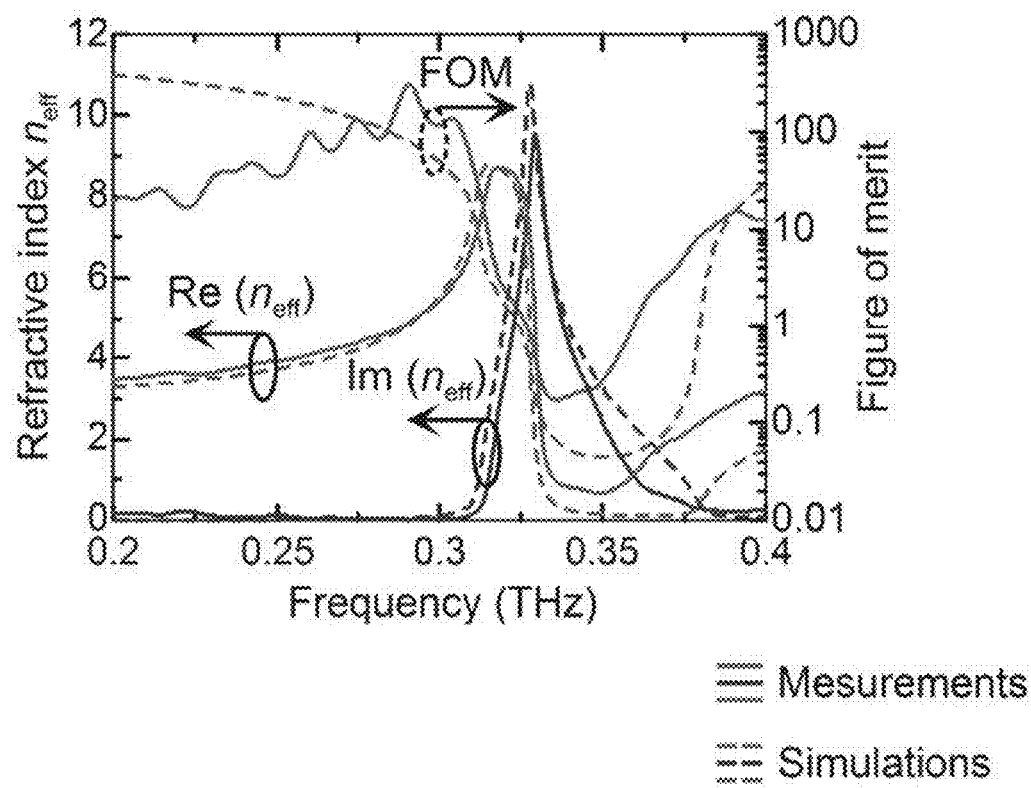
FIG. 20 is a graph showing the frequency response of a refractive index and that of an FOM in the sheet-type metamaterial according to the embodiment of this invention.
FIG. 21 is a table showing different exemplary dimensions of the unit cell in the sheet-type metamaterial according to the embodiment of this invention.

FIGS. 18 to 20 show analysis results obtained about the electrical characteristics of the unit cell 13 having the dimensions shown in FIG. 17 in the sheet-type metamaterial 1 according to this invention. In the description below, unless specified otherwise, the analysis was conducted by using the high-frequency three-dimensional electromagnetic field simulator HFSS and the analysis was conducted on condition that the first cut wire 10a and the second cut wire 11a are made of perfect conductors.

FIG. 18 is a contour chart of a refractive index at a frequency of 0.31 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 200 to 400 μm in the unit cell 13 having the dimensions shown in FIG. 17. By referring to FIG. 18, the refractive index tends to increase from three to nine with increase in the length l from 200 to about 340 μm. In particular, setting the length l at a value around 320 μm is found to be capable of obtaining a high refractive index throughout the above-described range of the gap g.

FIG. 19 is a contour chart of transmission power at a frequency of 0.31 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 200 to 400 μm in the unit cell 13 having the dimensions shown in FIG. 17. By referring to FIG. 19, setting the length l in a range from about 290 to about 310 μm is found to be capable of obtaining transmission power of about 80% or more throughout the above-described range of the gap g.

FIG. 20 shows the frequency response of the complex refractive index neff and that of a figure of merit (FOM) of the complex refractive index neff in a frequency band from 0.2 to 0.4 THz in the unit cell 13 having the dimensions shown in FIG. 17. By referring to FIG. 20, the real part Re(n) of the complex refractive index neff and the imaginary part Im(n) of the complex refractive index neff have characteristics similar to those described above by referring to FIG. 6, so that these parts will not be described. The experimental results show that the FOM of the refractive index is about 20 at 0.2 THz and increases gradually while increasing and decreasing with frequency increase to a maximum of about 314 at about 0.29 Thz. With subsequent frequency increase, the FOM decreases to about 60.1 at about 0.31 THz. With subsequent frequency increase, the FOM decreases to about 0.2 at about 0.33 THz. Then, the FOM increases to about 12 at 0.4 THz. The analysis results substantially agree with the experimental results in a range from about 0.275 to about 0.325 THz. In a range exceeding this frequency, the analysis results exhibit slightly smaller values than those of the experimental results. This shows that application of the sheet-type metamaterial 1 of this invention makes it possible to provide a flexible, flat, and thin lens available in a terahertz wave band.

Figure 22:
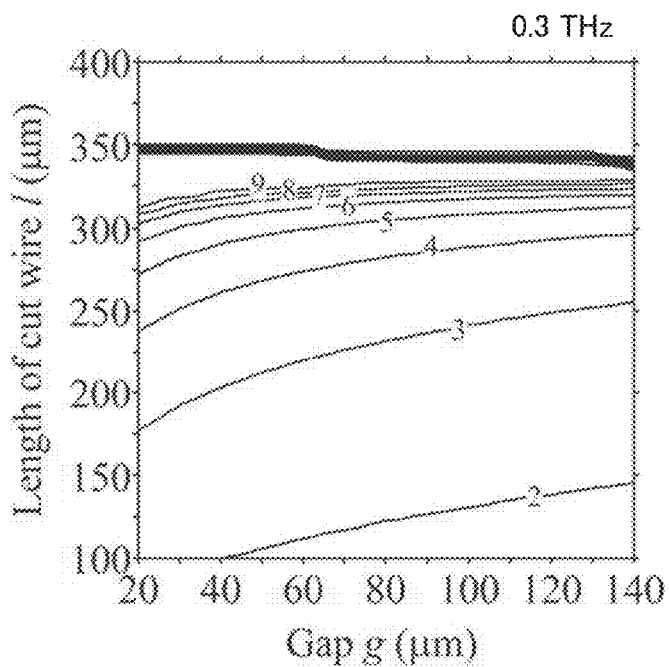
FIG. 22 is a contour chart of a refractive index at 0.3 THz with parameters including the gap g and the length l about the unit cell in the sheet-type metamaterial according to this invention.
Figure 23:
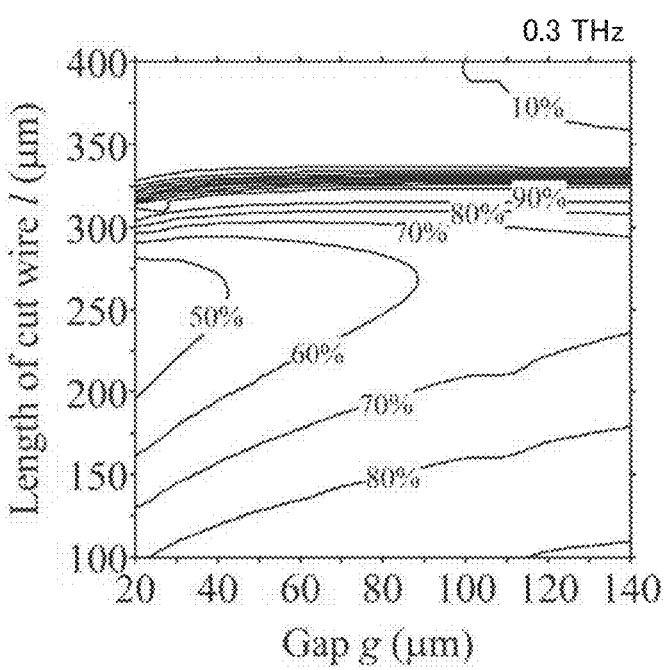
FIG. 23 is a contour chart of transmission power at 0.3 THz with parameters including the gap g and the length l about the unit cell in the sheet-type metamaterial according to this invention.

FIG. 21 shows different exemplary dimensions of the unit cell 13 with a design frequency set at 0.3 THz. According to the exemplary dimensions of the unit cell 13 shown in FIG. 21, the width w of the first cut wire 10a and the second cut wire 11a is set at about 50 μm, the space s between the first cut wires 10a and between the second cut wires 11a in the x-axis direction at about 160 μm, the thickness t of the first cut wire 10a and the second cut wire 11a at about 0.5 and the thickness d of the dielectric substrate 12 at about 50 μm. FIGS. 22 and 23 show analysis results obtained about the electrical characteristics of the unit cell 13 having the dimensions shown in FIG. 21 in the sheet-type metamaterial 1 according to this invention.

FIG. 22 is a contour chart of a refractive index at a frequency of 0.3 THz with the gap g (Gap) between the first cut wires 10a and between the second cut wires 11a in the y-axis direction set in a range from 20 to 140 and the length l (Length of cut wire) of the first cut wire 10a and the second cut wire 11a in a range from 100 to 400 in the unit cell 13 having the dimensions shown in FIG. 21. By referring to FIG. 22, the refractive index tends to increase from two to nine with increase in the length l from 100 to about 340 μm. In particular, setting the length l at a value around 320 μm is found to be capable of obtaining a high refractive index throughout the above-described range of the gap g.

FIG. 23 is a contour chart of transmission power at a frequency of 0.3 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 100 to 400 μm in the unit cell 13 having the dimensions shown in FIG. 21. By referring to FIG. 23, setting the length l in a range from about 300 to about 320 μm is found to be capable of obtaining transmission power of about 80% or more throughout the above-described range of the gap g.

FIG. 24 shows different exemplary dimensions of the unit cell 13 with a design frequency set at 0.3 THz. According to the exemplary dimensions of the unit cell 13 shown in FIG. 24, the length l of the first cut wire 10a and the second cut wire 11a is set at about 320 μm, the gap g between the first cut wires 10a and between the second cut wires 11a in the y-axis direction at about 80 μm, the thickness t of the first cut wire 10a and the second cut wire 11a at about 0.5 μm, and the thickness d of the dielectric substrate 12 at about 50 μm. FIGS. 25 and 26 show analysis results obtained about the electrical characteristics of the unit cell 13 having the dimensions shown in FIG. 24 in the sheet-type metamaterial 1 according to this invention.

FIG. 25 is a contour chart of a refractive index at a frequency of 0.3 THz with the width w (Width) of the first cut wire 10a and the second cut wire 11a set in a range from 10 to 150 μm, and the space s (Space) between the first cut wires 10a and between the second cut wires 11a in the x-axis direction in a range from 20 to 300 μm. By referring to FIG. 25, the refractive index is found to tend to increase to nine with decrease in the space s from 300 to about 20 μm and with increase in the width w from 10 to 150 μm.

FIG. 26 is a contour chart of transmission power at a frequency of 0.3 THz with the width w (Width) of the first cut wire 10a and the second cut wire 11a set in a range from 10 to 150 μm, and the space s (Space) between the first cut wires 10a and between the second cut wires 11a in the x-axis direction in a range from 20 to 300 μm. By referring to FIG. 26, setting the width w at a value around 70 μm is found to be capable of developing a tendency to obtain higher transmission power with increase in the space s. In particular, setting the width s in a range from about 60 to about 80 is found to be capable of obtaining transmission power of about 90% or more while the space s is in a range from about 140 to 300 μm.

The sheet-type metamaterial 1 according to this invention becomes applicable to a frequency band from 0.4 to 1.0 THz by employing the dimensions shown in FIG. 17. FIGS. 27 to 40 show analysis results obtained about the electrical characteristics of the unit cell 13 having the dimensions shown in FIG. 17 in the frequency band from 0.4 to 1.0 THz.

Figure 27:
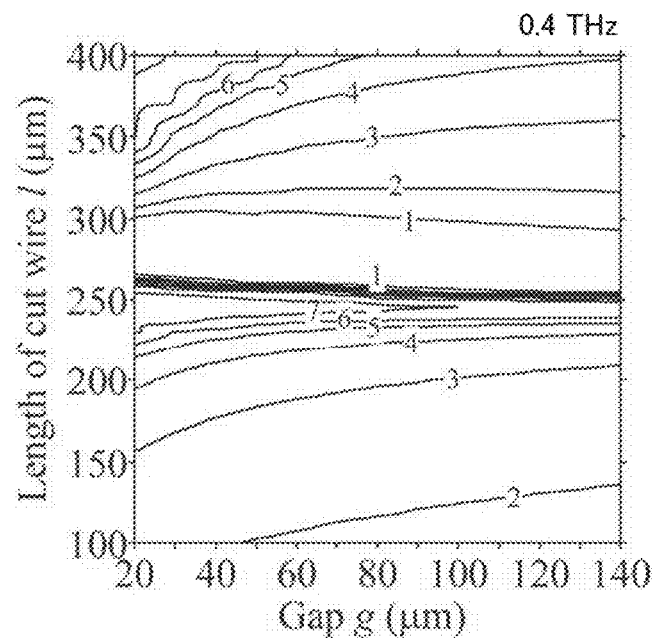
FIG. 27 is a contour chart of a refractive index at 0.4 THz with parameters including the gap g and the length l about the unit cell in the sheet-type metamaterial according to this invention.

FIG. 27 is a contour chart of a refractive index at a frequency of 0.4 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 100 to 400 μm in the unit cell 13 having the dimensions shown in FIG. 17. By referring to FIG. 27, the refractive index tends to increase from two to seven with increase in the length l from 100 to about 250 μm. Further, the refractive index tends to increase from one to six with increase in the length l from about 260 to about 360 μm. In particular, setting the length l at a value around 240 μm is found to be capable of obtaining a high refractive index throughout the above-described range of the gap g.

Figure 28:
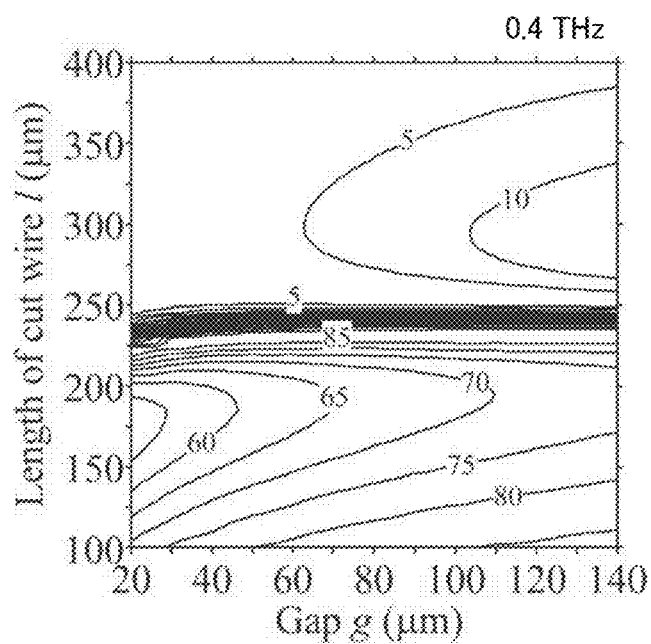
FIG. 28 is a contour chart of transmission power at 0.4 THz with parameters including the gap g and the length l about the unit cell in the sheet-type metamaterial according to this invention.

FIG. 28 is a contour chart of transmission power at a frequency of 0.4 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 100 to 400 μm in the unit cell 13 having the dimensions shown in FIG. 17. By referring to FIG. 28, setting the length l in a range from about 220 to about 230 μm is found to be capable of obtaining transmission power of about 80% or more throughout the above-described range of the gap g.

Figure 29:
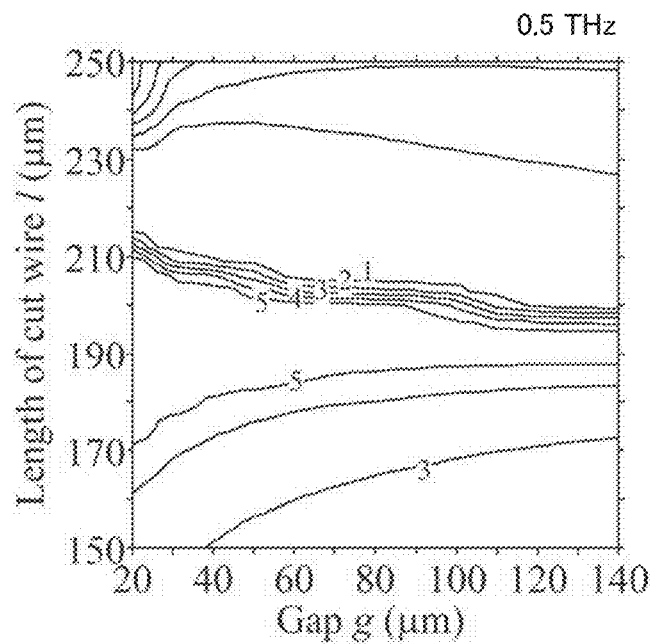
FIG. 29 is a contour chart of a refractive index at 0.5 THz with parameters including the gap g and the length l about the unit cell in the sheet-type metamaterial according to this invention.

FIG. 29 is a contour chart of a refractive index at a frequency of 0.5 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 150 to 250 μm in the unit cell 13 having the dimensions shown in FIG. 17. By referring to FIG. 29, the refractive index tends to increase from three to five with increase in the length l from 150 to about 200 μm. Further, setting the length l at a value around 190 μm is found to be capable of obtaining a high refractive index throughout the above-described range of the gap g.

Figure 30:
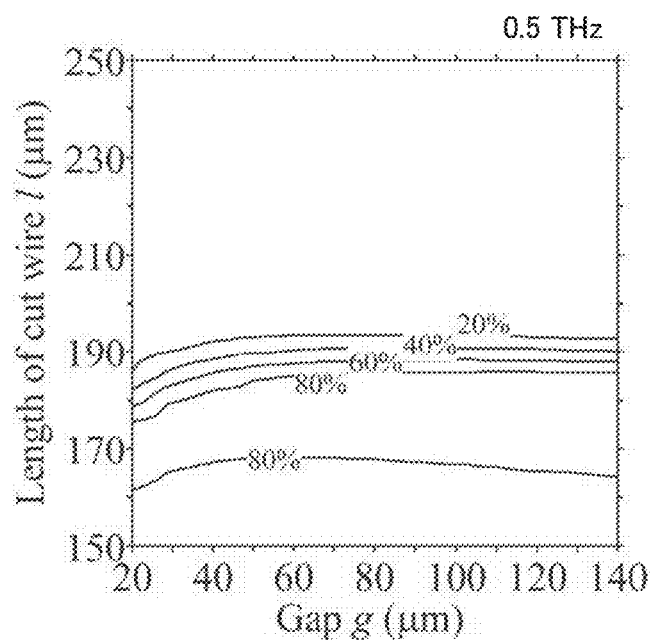
FIG. 30 is a contour chart of transmission power at 0.5 THz with parameters including the gap g and the length l about the unit cell in the sheet-type metamaterial according to this invention.

FIG. 30 is a contour chart of transmission power at a frequency of 0.5 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 150 to 250 μm in the unit cell 13 having the dimensions shown in FIG. 17. By referring to FIG. 30, setting the length l in a range from about 165 to about 175 μm is found to be capable of obtaining transmission power of about 80% or more throughout the above-described range of the gap g.

Figure 31:
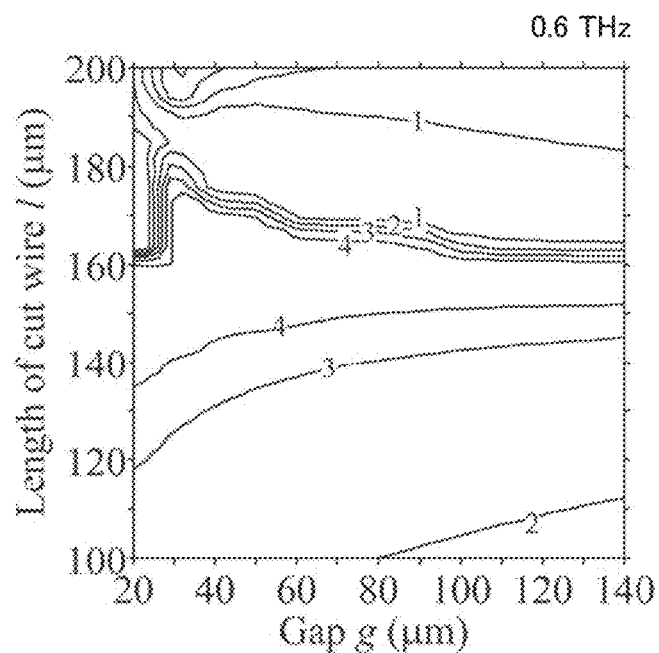
FIG. 31 is a contour chart of a refractive index at 0.6 THz with parameters including the gap g and the length l about the unit cell in the sheet-type metamaterial according to this invention.

FIG. 31 is a contour chart of a refractive index at a frequency of 0.6 THz with the gap g (Gap) between the first cut wires 10a and between the second cut wires 11a in the y-axis direction set in a range from 20 to 140 and the length l (Length of cut wire) of the first cut wire 10*a* and the second cut wire 11*a* in a range from 100 to 200 µm in the unit cell 13 having the dimensions shown in FIG. 17. By referring to FIG. 31, the refractive index tends to increase from two to four with increase in the length l from 100 to about 160 µm. Further, setting the length l at a value around 155 µm is found to be capable of obtaining a high refractive index throughout the above-described range of the gap g.

Figure 32:
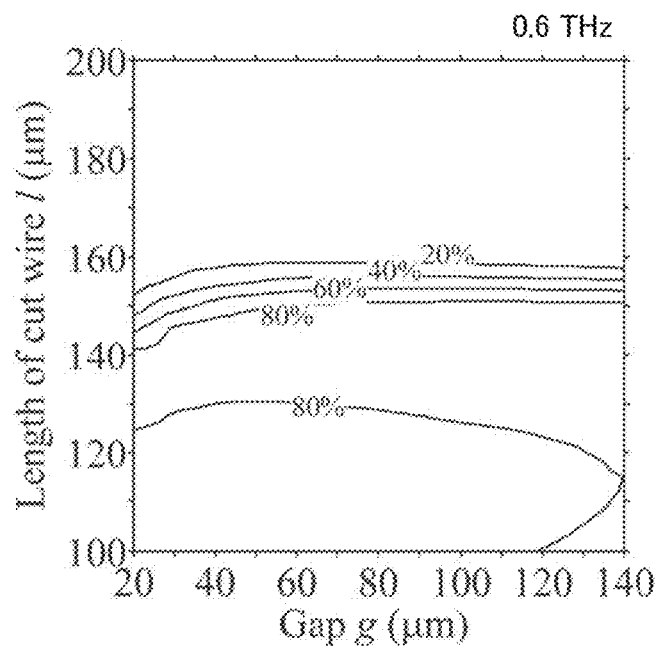
FIG. 32 is a contour chart of transmission power at 0.6 THz with parameters including the gap g and the length l about the unit cell in the sheet-type metamaterial according to this invention.

FIG. 32 is a contour chart of transmission power at a frequency of 0.6 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 100 to 200 µm in the unit cell 13 having the dimensions shown in FIG. 17. By referring to FIG. 32, setting the length l in a range from about 130 to about 140 µm is found to be capable of obtaining transmission power of about 80% or more throughout the above-described range of the gap g.

Figure 33:
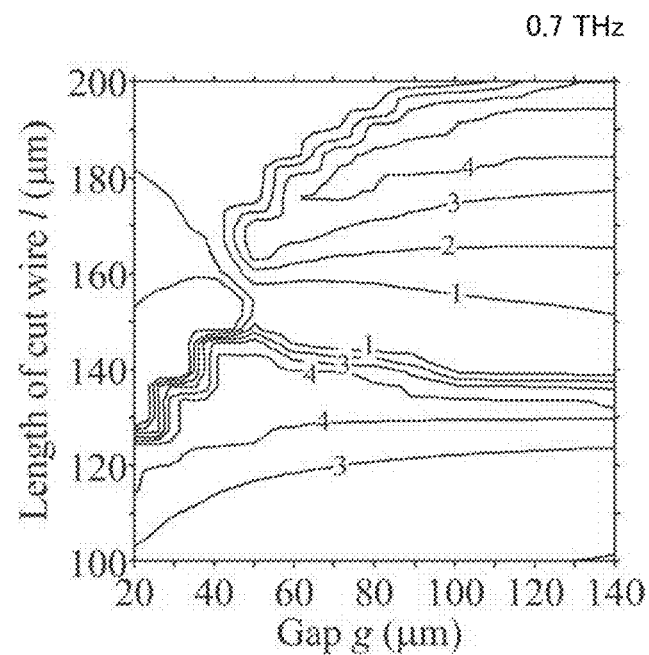
FIG. 33 is a contour chart of a refractive index at 0.7 THz with parameters including the gap g and the length l about the unit cell in the sheet-type metamaterial according to this invention.

FIG. 33 is a contour chart of a refractive index at a frequency of 0.7 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 100 to 200 µm in the unit cell 13 having the dimensions shown in FIG. 17. By referring to FIG. 33, the refractive index tends to increase from three to four with increase in the length l from 100 to about 140 µm. Further, setting the length l at a value around 130 µm is found to be capable of obtaining a high refractive index in a range from about 30 to 140 µm of the gap g.

Figure 34:
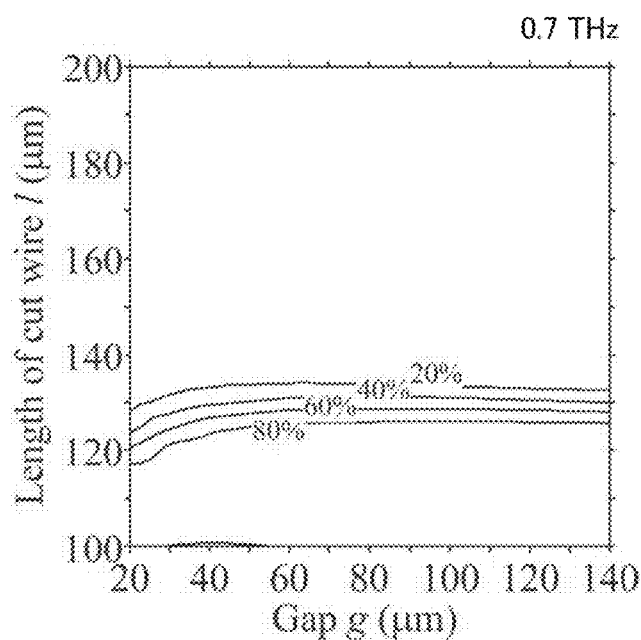
FIG. 34 is a contour chart of transmission power at 0.7 THz with parameters including the gap g and the length l about the unit cell in the sheet-type metamaterial according to this invention.

FIG. 34 is a contour chart of transmission power at a frequency of 0.7 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 100 to 200 m in the unit cell 13 having the dimensions shown in FIG. 17. By referring to FIG. 34, setting the length l in a range from 100 to about 115 µm is found to be capable of obtaining transmission power of about 80% or more throughout the above-described range of the gap g.

Figure 35:
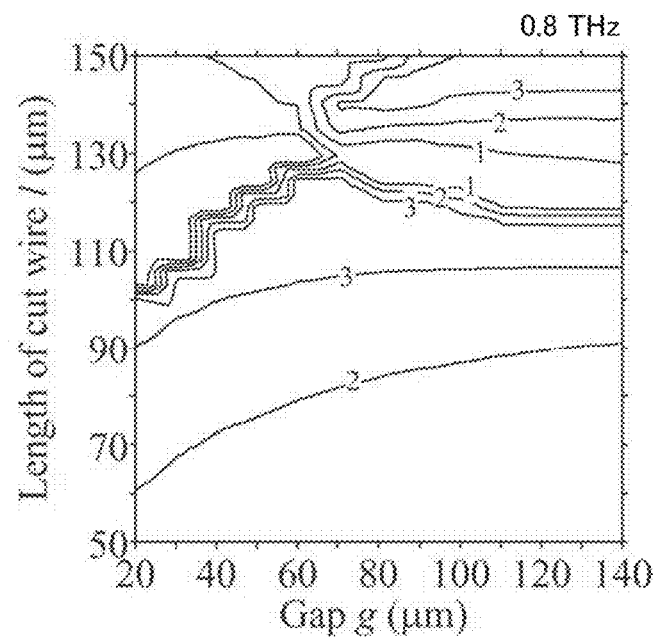
FIG. 35 is a contour chart of a refractive index at 0.8 THz with parameters including the gap g and the length l about the unit cell in the sheet-type metamaterial according to this invention.

FIG. 35 is a contour chart of a refractive index at a frequency of 0.8 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 35, the refractive index tends to increase from two to three with increase in the length l from 50 to about 110 µm. Further, setting the length l at a value around 110 µm is found to be capable of obtaining a high refractive index in a range from about 40 to 140 µm of the gap g.

Figure 36:
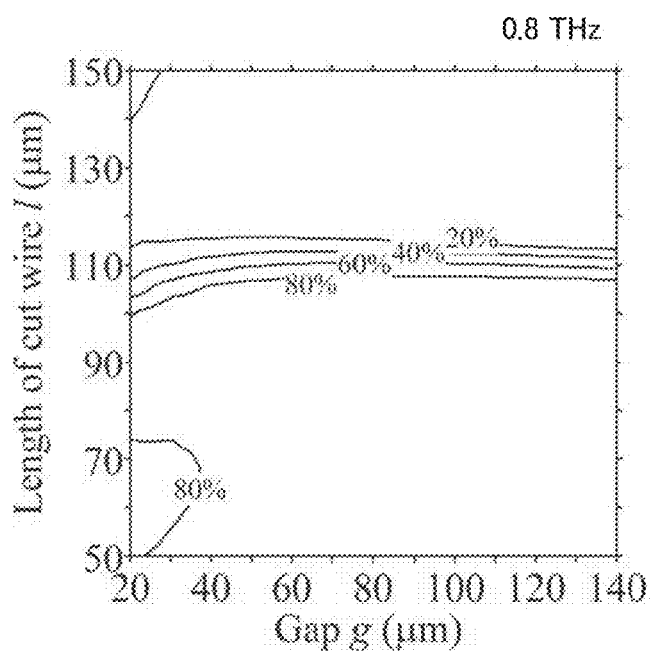
FIG. 36 is a contour chart of transmission power at 0.8 THz with parameters including the gap g and the length l about the unit cell in the sheet-type metamaterial according to this invention.

FIG. 36 is a contour chart of transmission power at a frequency of 0.8 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 36, setting the length l in a range from 50 to about 105 µm is found to be capable of obtaining transmission power of about 80% or more in a range from about 40 to 140 µm of the gap g.

Figure 37:
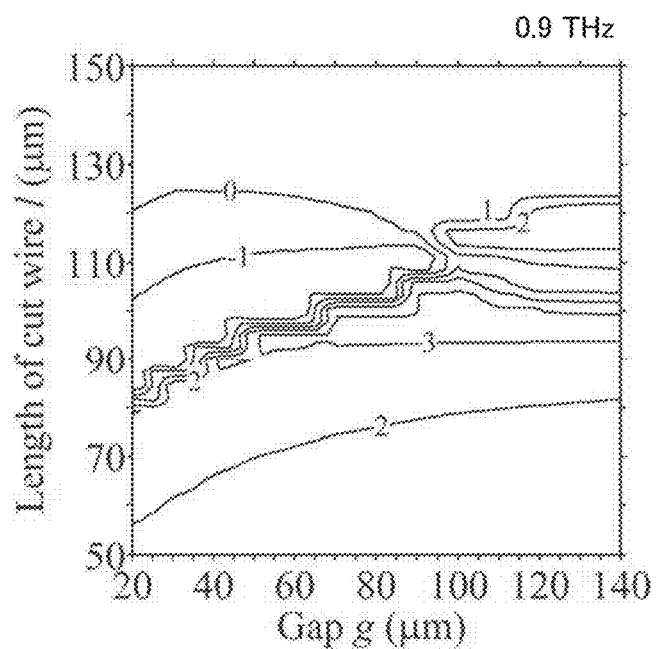
FIG. 37 is a contour chart of a refractive index at 0.9 THz with parameters including the gap g and the length l about the unit cell in the sheet-type metamaterial according to this invention.

FIG. 37 is a contour chart of a refractive index at a frequency of 0.9 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 37, the refractive index tends to increase from two to three with increase in the length l from 50 to about 90 µm. Further, setting the length l at a value around 85 µm is found to be capable of obtaining a high refractive index in a range from about 50 to 140 µm of the gap g.

Figure 38:
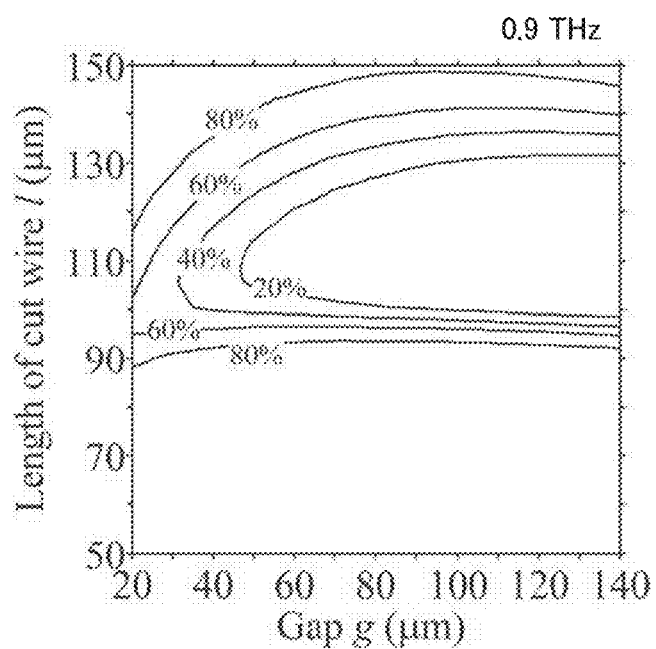
FIG. 38 is a contour chart of transmission power at 0.9 THz with parameters including the gap g and the length l about the unit cell in the sheet-type metamaterial according to this invention.

FIG. 38 is a contour chart of transmission power at a frequency of 0.9 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 38, setting the length l in a range from 50 to about 90 µm is found to be capable of obtaining transmission power of about 80% or more throughout the above-described range of the gap g.

Figure 39:
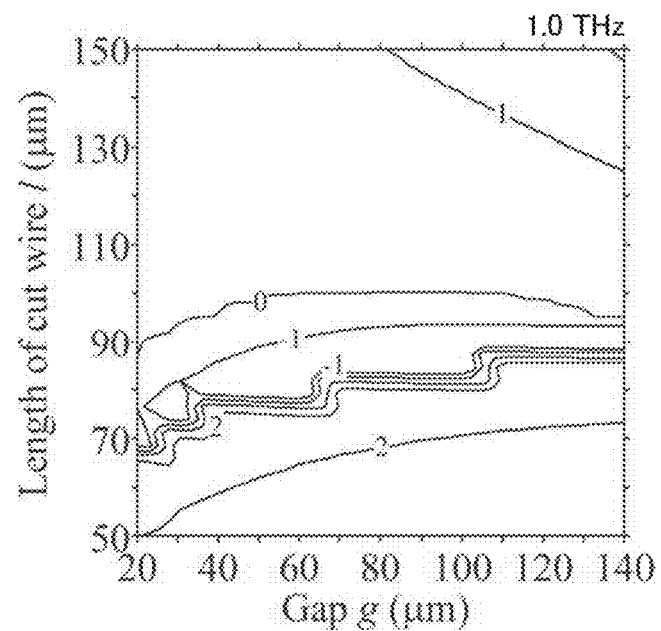
FIG. 39 is a contour chart of a refractive index at 1.0 THz with parameters including the gap g and the length l about the unit cell in the sheet-type metamaterial according to this invention.

FIG. 39 is a contour chart of a refractive index at a frequency of 1.0 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 39, the refractive index tends to increase to two with increase in the length l from 50 to about 80 µm. Further, setting the length l at a value around 75 µm is found to be capable of obtaining a high refractive index in a range from about 70 to 140 µm of the gap g.

Figure 40:
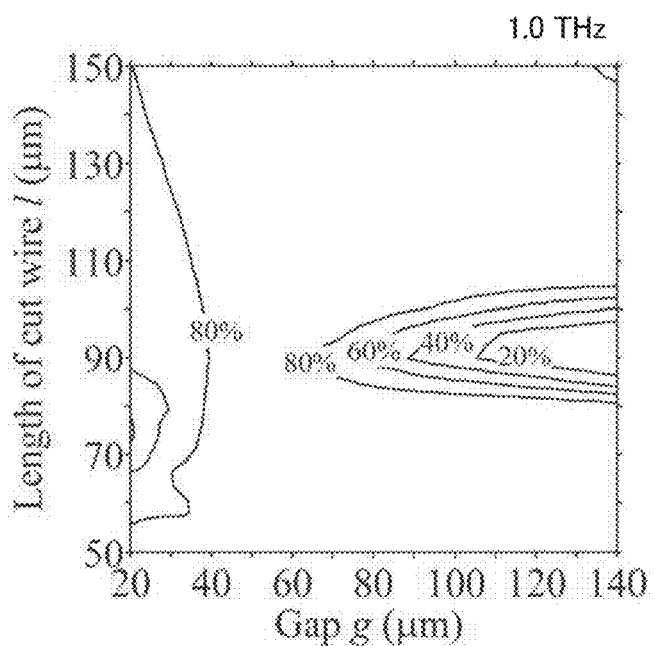
FIG. 40 is a contour chart of transmission power at 1.0 THz with parameters including the gap g and the length l about the unit cell in the sheet-type metamaterial according to this invention.

FIG. 40 is a contour chart of transmission power at a frequency of 1.0 THz with the gap g (Gap) between the first cut wires 10*a* and between the second cut wires 11*a* in the y-axis direction set in a range from 20 to 140 µm, and the length l (Length of cut wire) of the first cut wire 10*a* and the second cut wire 11*a* in a range from 50 to 150 µm in the unit cell 13 having the dimensions shown in FIG. 17. By referring to FIG. 40, setting the length l in a range from 50 to about 80 µm is found to be capable of obtaining transmission power of about 80% or more in a range from about 40 to 140 µm of the gap g. Further, setting the length l in a range from 105 to about 150 µm is found to be capable of obtaining transmission power of about 80% or more in a range from about 40 to 140 µm of the gap g.

FIG. 41 shows different exemplary dimensions of the unit cell 13 with a design frequency set at 1.5 THz. According to the exemplary dimensions of the unit cell 13 shown in FIG. 41, the width w of the first cut wire 10*a* and the second cut wire 11*a* is set at about 10 µm, the space s between the first cut wires 10*a* and between the second cut wires 11*a* in the x-axis direction at about 32 µm, the thickness t of the first cut wire 10*a* and the second cut wire 11*a* at about 0.5 µm, and the thickness d of the dielectric substrate 12 at about 50 µm. FIGS. 42 and 43 show analysis results obtained about the electrical characteristics of the unit cell 13 having the dimensions shown in FIG. 41 in the sheet-type metamaterial 1 according to this invention.

FIG. 42 is a contour chart of a refractive index at a frequency of 1.5 THz with the gap g (Gap) between the first cut wires 10*a* and between the second cut wires 11*a* in the y-axis direction set in a range from 20 to 100 µm, and the length l (Length of cut wire) of the first cut wire 10*a* and the second cut wire 11a in a range from 20 to 100 µm in the unit cell 13 having the dimensions shown in FIG. 41. By referring to FIG. 42, setting the length 1 in a range from 20 to about 55 µm is found to be capable of obtaining a refractive index of 1.5 throughout the above-described range of the gap g.

FIG. 43 is a contour chart of transmission power at a frequency of 1.5 THz with the gap g (Gap) between the first cut wires 10a and between the second cut wires 11a in the y-axis direction set in a range from 20 to 100 µm, and the length 1 (Length of cut wire) of the first cut wire 10a and the second cut wire 11a in a range from 20 to 100 µm in the unit cell 13 having the dimensions shown in FIG. 41. By referring to FIG. 43, setting the length 1 in a range from about 20 to about 40 µm is found to be capable of obtaining transmission power of about 80% or more throughout the above-described range of the gap g.

FIG. 44 shows different exemplary dimensions of the unit cell 13 with a design frequency set at 2.0 THz. According to the exemplary dimensions of the unit cell 13 shown in FIG. 44, the width w of the first cut wire 10a and the second cut wire 11a is set at about 7.5 µm, the space s between the first cut wires 10a and between the second cut wires 11a in the x-axis direction at about 24 µm, the thickness t of the first cut wire 10a and the second cut wire 11a at about 0.5 µm, and the thickness d of the dielectric substrate 12 at about 50 µm. FIGS. 45 and 46 show analysis results obtained about the electrical characteristics of the unit cell 13 having the dimensions shown in FIG. 44 in the sheet-type metamaterial 1 according to this invention.

FIG. 45 is a contour chart of a refractive index at a frequency of 2.0 THz with the gap g (Gap) between the first cut wires 10a and between the second cut wires 11a in the y-axis direction set in a range from 20 to 100 µm, and the length 1 (Length of cut wire) of the first cut wire 10a and the second cut wire 11a in a range from 20 to 100 µm in the unit cell 13 having the dimensions shown in FIG. 44. By referring to FIG. 45, setting the length 1 in a range from about 80 to about 90 µm is found to be capable of obtaining a refractive index of 1.0 in a range from about 20 to about 35 µm of the gap g. Setting the length 1 in a range from about 70 to about 80 µm is found to be capable of obtaining a refractive index of 1.0 in a range from about 30 to about 40 µm of the gap g. Setting the length 1 at about 60 µm is found to be capable of obtaining a refractive index of 1.0 in a range from about 50 to about 60 µm of the gap g. Further, setting the length 1 in a range from about 20 to about 50 µm is found to be capable of obtaining a refractive index of −1.0 throughout the above-described range of the gap g.

FIG. 46 is a contour chart of transmission power at a frequency of 2.0 THz with the gap g (Gap) between the first cut wires 10a and between the second cut wires 11a in the y-axis direction set in a range from 20 to 100 jam, and the length 1 (Length of cut wire) of the first cut wire 10a and the second cut wire 11a in a range from 20 to 100 jam in the unit cell 13 having the dimensions shown in FIG. 44. By referring to FIG. 46, setting the length 1 in a range from about 20 to about 25 jam is found to be capable of obtaining transmission power of about 80% or more throughout the above-described range of the gap g.

FIG. 47 shows different exemplary dimensions of the unit cell 13 with a design frequency set at 3.0 THz. According to the exemplary dimensions of the unit cell 13 shown in FIG. 47, the width w of the first cut wire 10a and the second cut wire 11a is set at about 5 jam, the space s between the first cut wires 10a and between the second cut wires 11a in the x-axis direction at about 16 jam, the thickness t of the first cut wire 10a and the second cut wire 11a at about 0.5 jam, and the thickness d of the dielectric substrate 12 at about 50 µm. FIGS. 48 and 49 show analysis results obtained about the electrical characteristics of the unit cell 13 having the dimensions shown in FIG. 47 in the sheet-type metamaterial 1 according to this invention.

FIG. 48 is a contour chart of a refractive index at a frequency of 3.0 THz with the gap g (Gap) between the first cut wires 10a and between the second cut wires 11a in the y-axis direction set in a range from 20 to 100 jam, and the length 1 (Length of cut wire) of the first cut wire 10a and the second cut wire 11a in a range from 20 to 100 jam in the unit cell 13 having the dimensions shown in FIG. 47. By referring to FIG. 48, setting the length 1 in a range from about 35 to about 45 µm is found to be capable of obtaining a refractive index of 0.5 in a range from about 20 to about 30 µm of the gap g. Further, setting the length 1 in a range from 20 to about 30 µm is found to result in a refractive index of 0 throughout the above-described range of the gap g.

FIG. 49 is a contour chart of transmission power at a frequency of 3.0 THz with the gap g (Gap) between the first cut wires 10a and between the second cut wires 11a in the y-axis direction set in a range from 20 to 100 µm, and the length 1 (Length of cut wire) of the first cut wire 10a and the second cut wire 11a in a range from 20 to 100 µm in the unit cell 13 having the dimensions shown in FIG. 47. By referring to FIG. 49, setting the length 1 in a range from 20 to about 25 µm is found to be capable of obtaining transmission power of about 80% or more in a range from 20 to about 65 µm of the gap g.

FIG. 50 shows different exemplary dimensions of the unit cell 13 with a design frequency set at 0.3 THz. According to the exemplary dimensions of the unit cell 13 shown in FIG. 50, the width w of the first cut wire 10a and the second cut wire 11a is set at about 50 µm, the space s between the first cut wires 10a and between the second cut wires 11a in the x-axis direction at about 160 µm, the thickness t of the first cut wire 10a and the second cut wire 11a at about 0.5 µm, and the thickness d of the dielectric substrate 12 at about 23 µm. FIGS. 51 and 52 show analysis results obtained about the electrical characteristics of the unit cell 13 having the dimensions shown in FIG. 50 in the sheet-type metamaterial 1 according to this invention.

FIG. 51 is a contour chart of a refractive index at a frequency of 0.3 THz with the gap g (Gap) between the first cut wires 10a and between the second cut wires 11a in the y-axis direction set in a range from 20 to 140 µm, and the length 1 (Length of cut wire) of the first cut wire 10a and the second cut wire 11a in a range from 250 to 350 µm in the unit cell 13 having the dimensions shown in FIG. 50. By referring to FIG. 51, the refractive index tends to increase from four to 16 with increase in the length 1 from 250 to about 340 µm. In particular, setting the length 1 at a value around 330 µm is found to be capable of obtaining a high refractive index throughout the above-described range of the gap g.

FIG. 52 is a contour chart of transmission power at a frequency of 0.3 THz with the gap g (Gap) between the first cut wires 10a and between the second cut wires 11a in the y-axis direction set in a range from 20 to 140 µm, and the length 1 (Length of cut wire) of the first cut wire 10a and the second cut wire 11a in a range from 250 to 350 µm in the unit cell 13 having the dimensions shown in FIG. 50. By referring to FIG. 52, setting the length 1 in a range from 250 to about 325 µm is found to be capable of obtaining transmission power of about 60% or more in a range from about 100 to 140 µm of the gap g.

FIG. 53 shows different exemplary dimensions of the unit cell 13 with a design frequency set at 0.3 THz. According to the exemplary dimensions of the unit cell 13 shown in FIG. 53, the width w of the first cut wire 10a and the second cut wire 11a is set at about 50 μm, the gap g between the first cut wires 10a and between the second cut wires 11a in the y-axis direction at about 80 μm, the thickness t of the first cut wire 10a and the second cut wire 11a at about 0.5 μm, and the thickness d of the dielectric substrate 12 at about 23 μm. FIGS. 54 and 55 show analysis results obtained about the electrical characteristics of the unit cell 13 having the dimensions shown in FIG. 53 in the sheet-type metamaterial 1 according to this invention.

FIG. 54 is a contour chart of a refractive index at a frequency of 0.3 THz with the space s (Space) between the first cut wires 10a and between the second cut wires 11a in the x-axis direction set in a range from 50 to 300 μm, and the length l (Length of cut wire) of the first cut wire 10a and the second cut wire 11a in a range from 250 to 350 μm in the unit cell 13 having the dimensions shown in FIG. 53. By referring to FIG. 54, the refractive index tends to increase from four to 16 with increase in the length l from 250 to about 335 μm. In particular, setting the length l at a value around 330 μm is found to be capable of obtaining a high refractive index throughout the above-described range of the gap g.

FIG. 55 is a contour chart of transmission power at a frequency of 0.3 THz with the space s (Space) between the first cut wires 10a and between the second cut wires 11a in the x-axis direction set in a range from 50 to 300 μm, and the length l (Length of cut wire) of the first cut wire 10a and the second cut wire 11a in a range from 250 to 350 μm in the unit cell 13 having the dimensions shown in FIG. 53. By referring to FIG. 55, increase in the space s is found to be capable of developing a tendency to obtain higher transmission power. In particular, setting the length l at a value around 315 μm is found to be capable of obtaining transmission power of about 60% or more in a range from 50 to 250 μm of the space s. Setting the length l at 250 μm is found to be capable of obtaining transmission power of about 60% or more in a range from about 115 to 300 μm of the space s. Further, setting the length l at 290 μm is found to be capable of obtaining transmission power of about 60% or more in a range from about 230 to 300 μm of the space s.

FIG. 56 shows different exemplary dimensions of the unit cell 13 with a design frequency set in a range from 0.4 to 1.0 THz. According to the exemplary dimensions of the unit cell 13 shown in FIG. 56, the width w of the first cut wire 10a and the second cut wire 11a is set at about 50 μm, the space s between the first cut wires 10a and between the second cut wires 11a in the x-axis direction at about 160 μm, the thickness t of the first cut wire 10a and the second cut wire 11a at about 0.5 μm, and the thickness d of the dielectric substrate 12 at about 23 μm. FIGS. 57 to 70 show analysis results obtained about the electrical characteristics of the unit cell 13 having the dimensions shown in FIG. 56 in the frequency band from 0.4 to 1.0 THz.

FIG. 57 is a contour chart of a refractive index at a frequency of 0.4 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 200 to 300 μm in the unit cell 13 having the dimensions shown in FIG. 56. By referring to FIG. 57, the refractive index tends to increase from four to 12 with increase in the length l from 200 to about 250 μm. In particular, setting the length l at a value around 250 μm is found to be capable of obtaining a high refractive index throughout the above-described range of the gap g.

FIG. 58 is a contour chart of transmission power at a frequency of 0.4 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 200 to 300 μm in the unit cell 13 having the dimensions shown in FIG. 56. By referring to FIG. 58, setting the length l in a range from 200 to about 240 μm is found to be capable of developing a tendency to obtain higher transmission power with increase in the gap g. In particular, setting the length l in a range from 200 to about 240 μm is found to be capable of obtaining transmission power of about 60% or more in a range from about 75 to 140 μm of the gap g.

Figure 59:
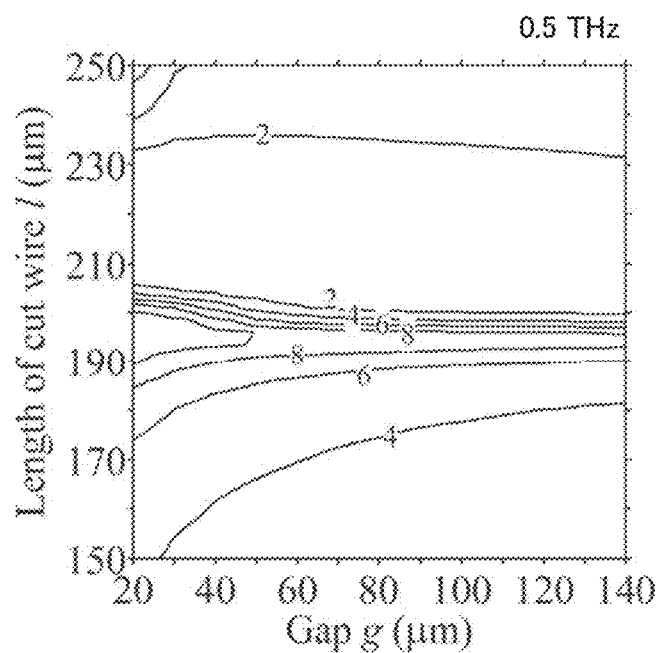
FIG. 59 is a contour chart of a refractive index at 0.5 THz with parameters including the gap g and the length l about the unit cell in the sheet-type metamaterial according to this invention.

FIG. 59 is a contour chart of a refractive index at a frequency of 0.5 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 150 to 250 μm in the unit cell 13 having the dimensions shown in FIG. 56. By referring to FIG. 59, the refractive index tends to increase from four to eight with increase in the length l from 150 to about 200 μm. In particular, setting the length l at a value around 195 μm is found to be capable of obtaining a high refractive index throughout the above-described range of the gap g.

Figure 60:
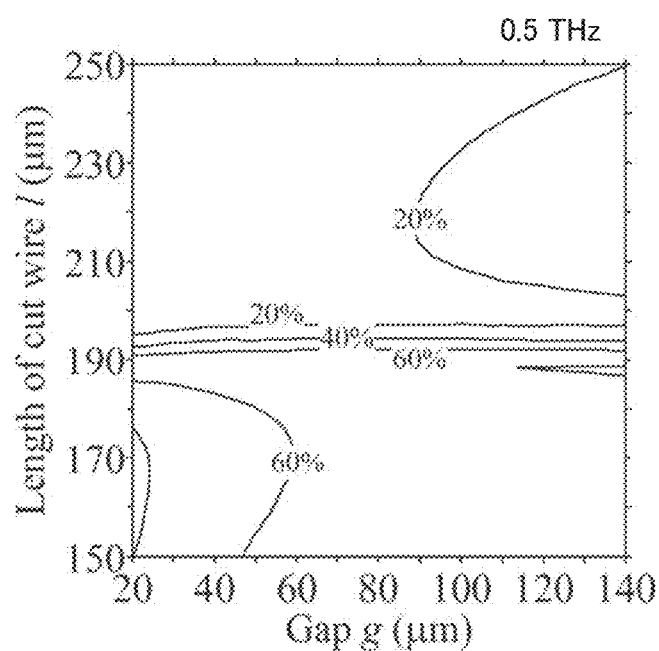
FIG. 60 is a contour chart of transmission power at 0.5 THz with parameters including the gap g and the length l about the unit cell in the sheet-type metamaterial according to this invention.

FIG. 60 is a contour chart of transmission power at a frequency of 0.5 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 150 to 250 μm in the unit cell 13 having the dimensions shown in FIG. 56. By referring to FIG. 60, setting the length l in a range from 150 to about 190 μm is found to be capable of developing a tendency to obtain higher transmission power with increase in the gap g. In particular, setting the length l in a range from 150 to about 190 μm is found to be capable of obtaining transmission power of about 60% or more in a range from about 60 to 140 μm of the gap g.

Figure 61:
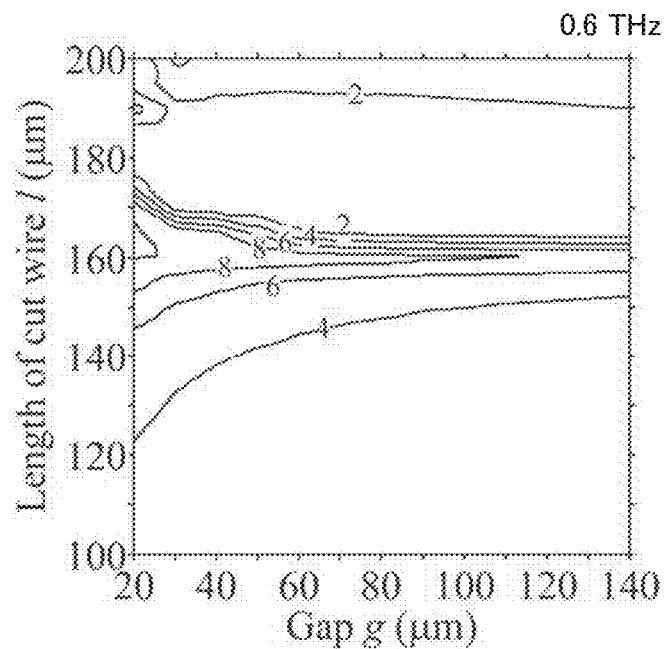
FIG. 61 is a contour chart of a refractive index at 0.6 THz with parameters including the gap g and the length l about the unit cell in the sheet-type metamaterial according to this invention.

FIG. 61 is a contour chart of a refractive index at a frequency of 0.6 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 100 to 200 μm in the unit cell 13 having the dimensions shown in FIG. 56. By referring to FIG. 61, the refractive index tends to increase from four to eight with increase in the length l from 100 to about 150 μm. In particular, setting the length l at a value around 160 μm is found to be capable of obtaining a high refractive index throughout the above-described range of the gap g.

Figure 62:
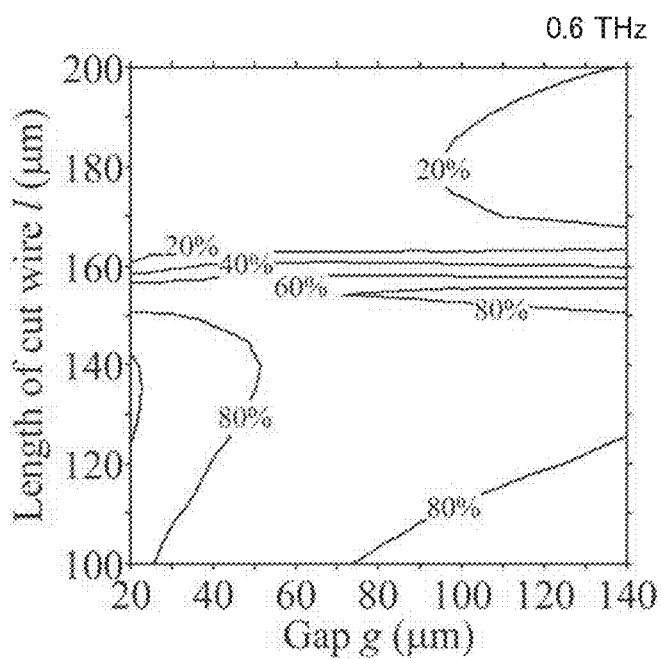
FIG. 62 is a contour chart of transmission power at 0.6 THz with parameters including the gap g and the length l about the unit cell in the sheet-type metamaterial according to this invention.

FIG. 62 is a contour chart of transmission power at a frequency of 0.6 THz with the gap g (Gap) between the first cut wires 10a and between the second cut wires 11a in the y-axis direction set in a range from 20 to 140 μm, and the length l (Length of cut wire) of the first cut wire 10a and the second cut wire 11a in a range from 100 to 200 m in the unit cell 13 having the dimensions shown in FIG. 56. By referring to FIG. 62, setting the length l in a range from 100 to about 160 µm is found to be capable of obtaining transmission power of about 60% or more in a range from about 50 to 140 µm of the gap g.

Figure 63:
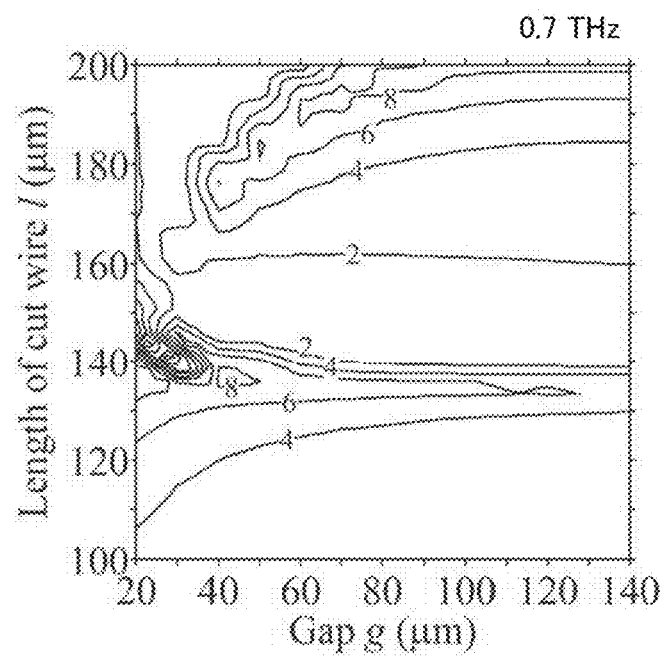
FIG. 63 is a contour chart of a refractive index at 0.7 THz with parameters including the gap g and the length l about the unit cell in the sheet-type metamaterial according to this invention.

FIG. 63 is a contour chart of a refractive index at a frequency of 0.7 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 100 to 200 µm in the unit cell 13 having the dimensions shown in FIG. 56. By referring to FIG. 63, the refractive index tends to increase from four to eight with increase in the length l from 100 to about 135 µm. In particular, setting the length l at a value around 130 µm is found to be capable of obtaining a high refractive index throughout the above-described range of the gap g.

Figure 64:
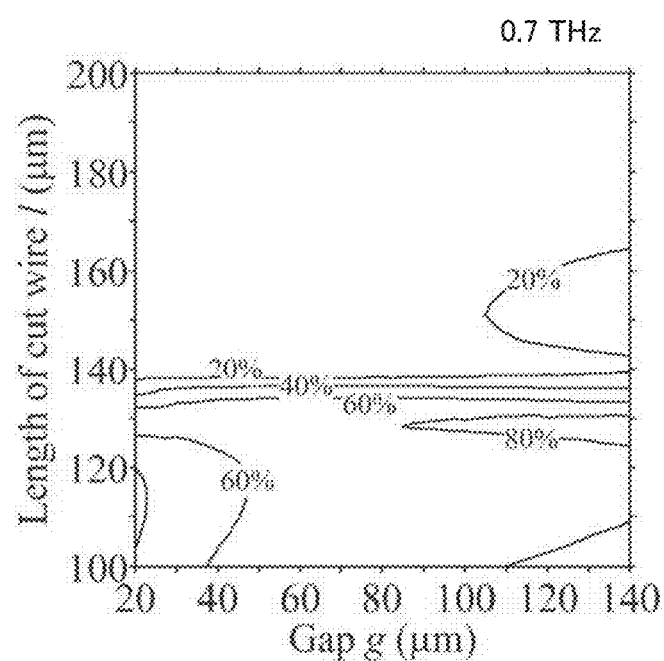
FIG. 64 is a contour chart of transmission power at 0.7 THz with parameters including the gap g and the length l about the unit cell in the sheet-type metamaterial according to this invention.

FIG. 64 is a contour chart of transmission power at a frequency of 0.7 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 100 to 200 µm in the unit cell 13 having the dimensions shown in FIG. 56. By referring to FIG. 64, setting the length l in a range from 100 to about 135 µm is found to be capable of obtaining transmission power of about 60% or more in a range from about 50 to 140 µm of the gap g.

Figure 65:
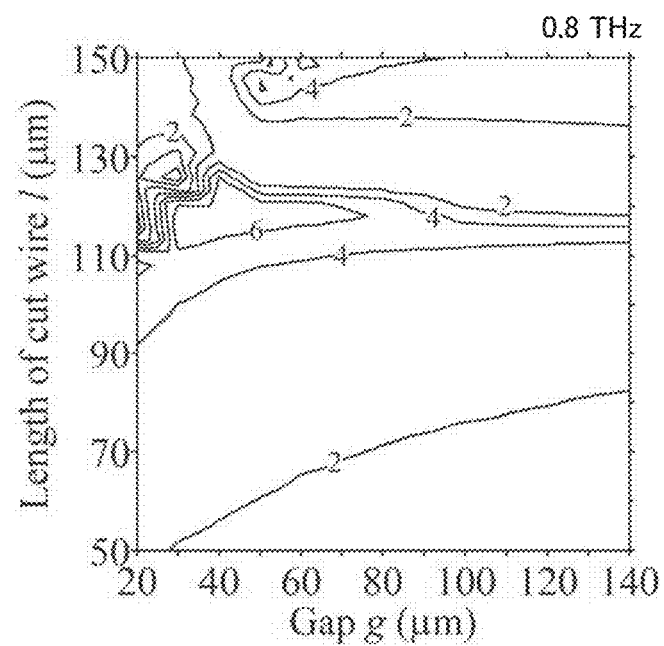
FIG. 65 is a contour chart of a refractive index at 0.8 THz with parameters including the gap g and the length l about the unit cell in the sheet-type metamaterial according to this invention.

FIG. 65 is a contour chart of a refractive index at a frequency of 0.8 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 65, the refractive index tends to increase from two to six with increase in the length l from 50 to about 120 µm. In particular, setting the length l at a value around 120 µm is found to be capable of obtaining a high refractive index throughout the above-described range of the gap g.

Figure 66:
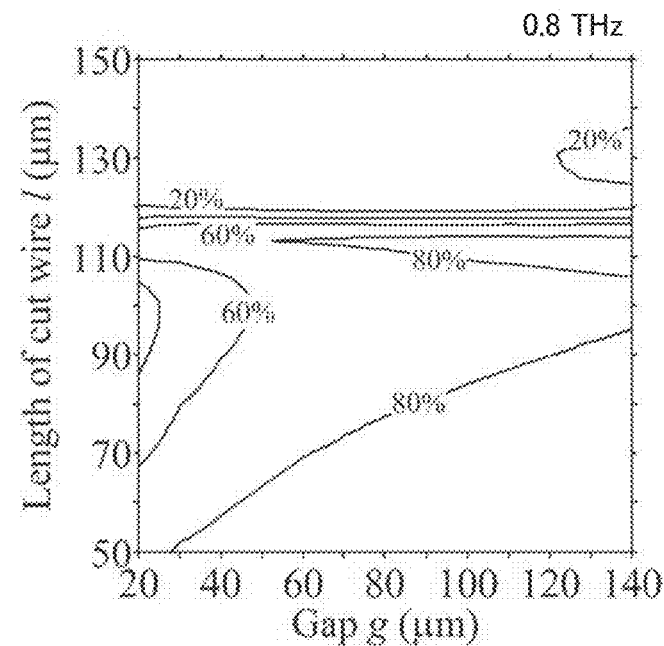
FIG. 66 is a contour chart of transmission power at 0.8 THz with parameters including the gap g and the length l about the unit cell in the sheet-type metamaterial according to this invention.

FIG. 66 is a contour chart of transmission power at a frequency of 0.8 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 66, setting the length l in a range from 50 to about 115 µm is found to be capable of obtaining transmission power of about 60% or more in a range from about 50 to 140 µm of the gap g.

Figure 67:
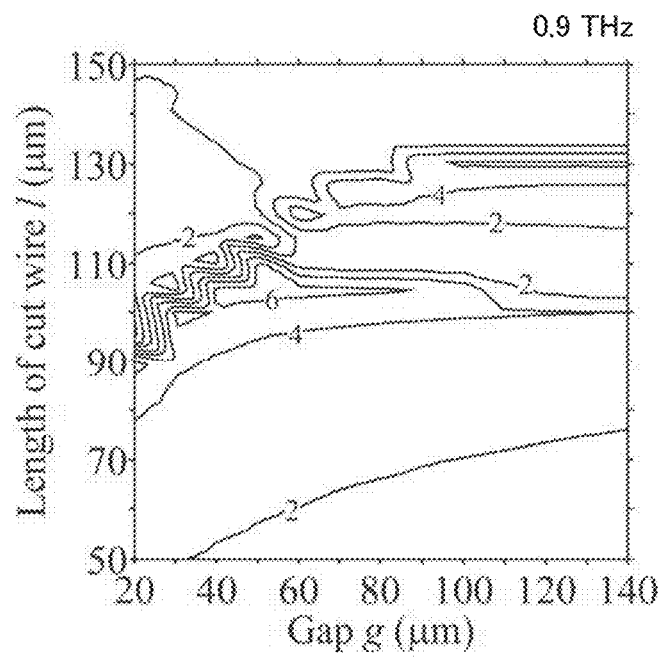
FIG. 67 is a contour chart of a refractive index at 0.9 THz with parameters including the gap g and the length l about the unit cell in the sheet-type metamaterial according to this invention.

FIG. 67 is a contour chart of a refractive index at a frequency of 0.9 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 67, the refractive index tends to increase from two to six with increase in the length l from 50 to about 110 µm. In particular, setting the length l at a value around 105 µm is found to be capable of obtaining a high refractive index throughout the above-described range of the gap g.

Figure 68:
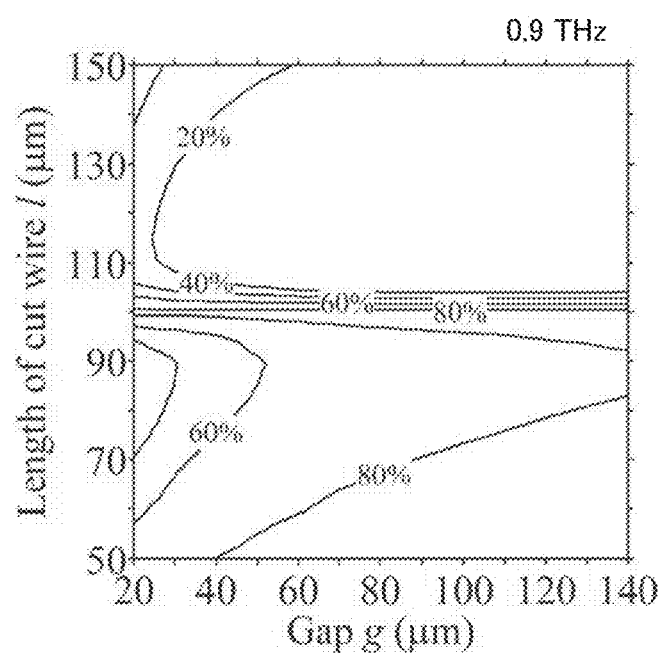
FIG. 68 is a contour chart of transmission power at 0.9 THz with parameters including the gap g and the length l about the unit cell in the sheet-type metamaterial according to this invention.

FIG. 68 is a contour chart of transmission power at a frequency of 0.9 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 68, setting the length l in a range from 50 to about 100 µm is found to be capable of obtaining transmission power of about 60% or more in a range from about 50 to 140 µm of the gap g.

Figure 69:
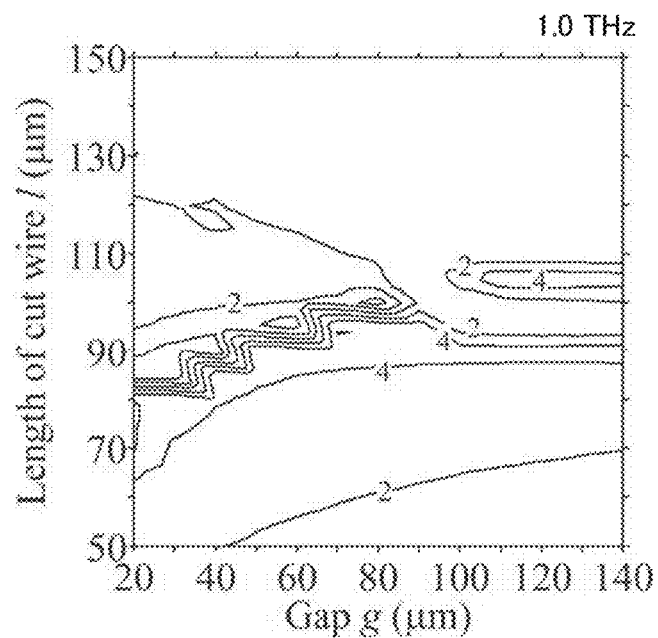
FIG. 69 is a contour chart of a refractive index at 1.0 THz with parameters including the gap g and the length l about the unit cell in the sheet-type metamaterial according to this invention.

FIG. 69 is a contour chart of a refractive index at a frequency of 1.0 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 69, the refractive index tends to increase from two to four with increase in the length l from 50 to about 90 µm. In particular, setting the length l at a value around 90 µm is found to be capable of obtaining a high refractive index throughout the above-described range of the gap g.

Figure 70:
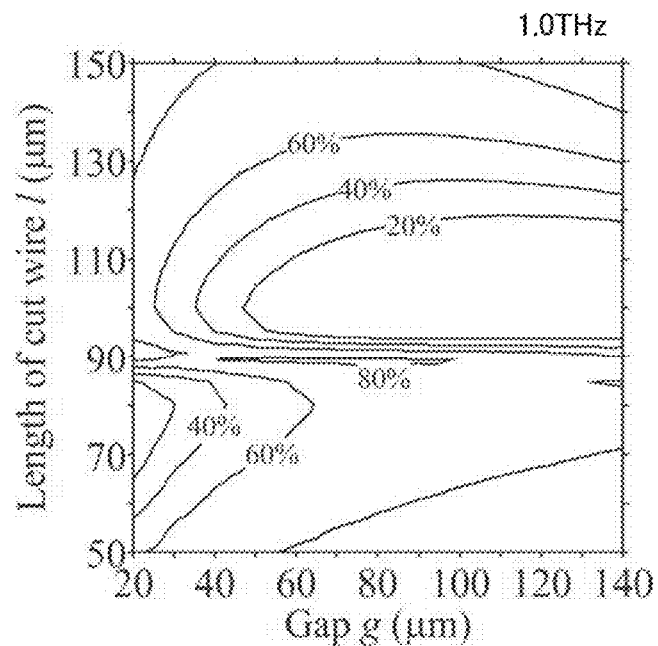
FIG. 70 is a contour chart of transmission power at 1.0 THz with parameters including the gap g and the length l about the unit cell in the sheet-type metamaterial according to this invention.

FIG. 70 is a contour chart of transmission power at a frequency of 1.0 THz with the gap g (Gap) between the first cut wires 10a and between the second cut wires 11a in the y-axis direction set in a range from 20 to 140 µm, and the length l (Length of cut wire) of the first cut wire 10a and the second cut wire 11a in a range from 50 to 150 µm in the unit cell 13 having the dimensions shown in FIG. 56. By referring to FIG. 70, setting the length l in a range from 50 to about 90 µm is found to be capable of obtaining transmission power of about 60% or more in a range from about 60 to about 140 µm of the gap g.

FIG. 71 shows different exemplary dimensions of the unit cell 13 with a design frequency set at 1.5 THz. According to the exemplary dimensions of the unit cell 13 shown in FIG. 71, the width w of the first cut wire 10a and the second cut wire 11a is set at about 10 µm, the space s between the first cut wires 10a and between the second cut wires 11a in the x-axis direction at about 32 µm, the thickness t of the first cut wire 10a and the second cut wire 11a at about 0.5 µm, and the thickness d of the dielectric substrate 12 at about 23 µm. FIGS. 72 and 73 show analysis results obtained about the electrical characteristics of the unit cell 13 having the dimensions shown in FIG. 71 in the sheet-type metamaterial 1 according to this invention.

FIG. 72 is a contour chart of a refractive index at a frequency of 1.5 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 71. By referring to FIG. 72, the refractive index tends to increase from two to four with increase in the length l from 20 to about 60 µm. In particular, setting the length l at about 60 µm is found to be capable of obtaining a refractive index of 4.0 throughout the above-described range of the gap g.

FIG. 73 is a contour chart of transmission power at a frequency of 1.5 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 71. By referring to FIG. 73, setting the length l in a range from 20 to about 55 µm is found to be capable of obtaining transmission power of about 60% or more throughout the above-described range of the gap g.

FIG. 74 shows different exemplary dimensions of the unit cell 13 with a design frequency set at 2.0 THz. According to the exemplary dimensions of the unit cell 13 shown in FIG. 74, the width w of the first cut wire 10a and the second cut wire 11a is set at about 7.5 µm, the space s between the first cut wires 10a and between the second cut wires 11a in the x-axis direction at about 24 µm, the thickness t of the first cut wire 10a and the second cut wire 11a at about 0.5 µm, and the thickness d of the dielectric substrate 12 at about 23 µm. FIGS. 75 and 76 show analysis results obtained about the electrical characteristics of the unit cell 13 having the dimensions shown in FIG. 74 in the sheet-type metamaterial 1 according to this invention.

FIG. 75 is a contour chart of a refractive index at a frequency of 2.0 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 74. By referring to FIG. 75, the refractive index tends to increase from two to three with increase in the length l from 20 to about 50 µm. In particular, setting the length l at a value around 50 µm is found to be capable of obtaining a refractive index of 3.0 in a range from about 20 to about 30 µm of the gap g.

FIG. 76 is a contour chart of transmission power at a frequency of 2.0 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 74. By referring to FIG. 76, setting the length l in a range from 20 to about 35 µm is found to be capable of obtaining transmission power of about 60% or more throughout the above-described range of the gap g.

FIG. 77 shows different exemplary dimensions of the unit cell 13 with a design frequency set at 3.0 THz. According to the exemplary dimensions of the unit cell 13 shown in FIG. 77, the width w of the first cut wire 10a and the second cut wire 11a is set at about 5 µm, the space s between the first cut wires 10a and between the second cut wires 11a in the x-axis direction at about 16 µm, the thickness t of the first cut wire 10a and the second cut wire 11a at about 0.5 µm, and the thickness d of the dielectric substrate 12 at about 23 µm. FIGS. 78 and 79 show analysis results obtained about the electrical characteristics of the unit cell 13 having the dimensions shown in FIG. 77 in the sheet-type metamaterial 1 according to this invention.

FIG. 78 is a contour chart of a refractive index at a frequency of 3.0 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 77. By referring to FIG. 78, setting the length l at a value around 60 µm is found to be capable of obtaining a refractive index of two in a range from 20 to about 30 µm of the gap g. Further, setting the length l at a value around 30 µm is found to be capable of obtaining a refractive index of two in a range from 20 to about 40 µm and a range from about 70 to about 85 µm of the gap g.

FIG. 79 is a contour chart of transmission power at a frequency of 3.0 THz with the gap g (Gap) between the first cut wires 10a and between the second cut wires 11a in the y-axis direction set in a range from 20 to 100 µm, and the length l (Length of cut wire) of the first cut wire 10a and the second cut wire 11a in a range from 20 to 100 µm in the unit cell 13 having the dimensions shown in FIG. 77. By referring to FIG. 79, setting the length l in a range from about 85 to about 105 µm is found to be capable of obtaining transmission power of about 80% or more in a range of the gap g such as that from 40 to about 60 µm.

Figure 80A:
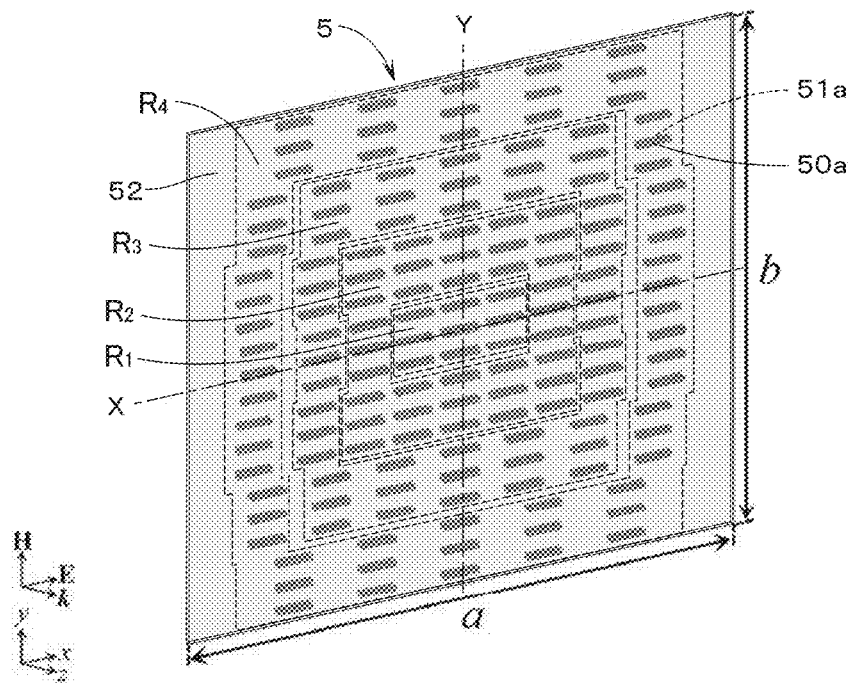
FIG. 80A is a perspective view showing the configuration of a sheet-type lens according to the embodiment of this invention.
Figure 80B:
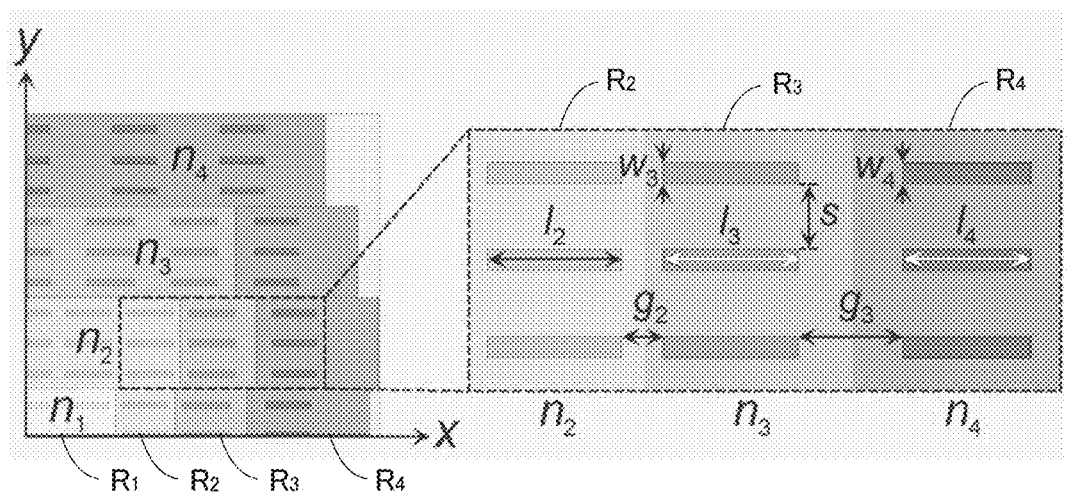
FIG. 80B is a partial enlarged view showing the configuration of the sheet-type lens according to the embodiment of this invention.
Figures 81A, 81B, 82:
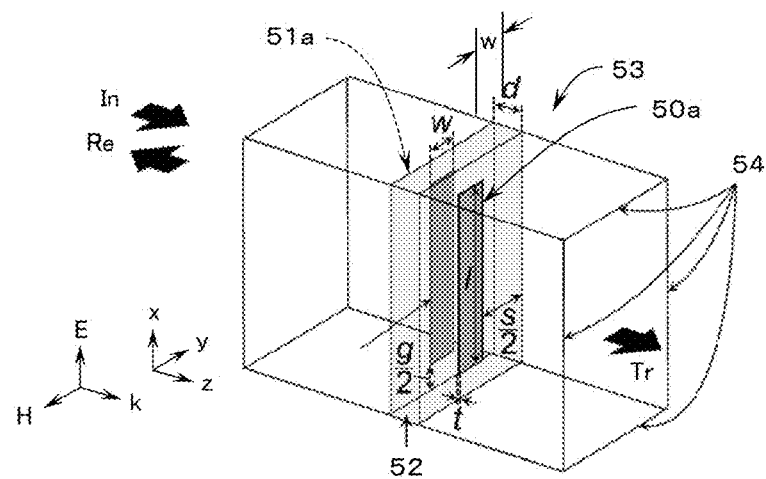
FIG. 81A is a table showing exemplary dimensions of the sheet-type lens according to the embodiment of this invention.
FIG. 81B is a different table showing exemplary dimensions of the sheet-type lens according to the embodiment of this invention.
FIG. 82 is a perspective view showing the configuration of a unit cell with a periodic boundary wall in the sheet-type lens according to the embodiment of this invention and a table showing exemplary dimensions of the unit cell.

FIG. 80A is a perspective view showing the configuration of a sheet-type lens 5 according to the embodiment of this invention using the sheet-type metamaterial according to this invention. FIG. 80B is an enlarged view of a one-quarter model of the sheet-type lens 5. FIGS. 81A and 81B are tables each showing exemplary dimensions of the sheet-type lens 5 of this invention. FIG. 82 is a perspective view showing the configuration of a unit cell with a periodic boundary wall corresponding to the configuration of one period of the sheet-type lens 5 according to this invention.

As shown in FIG. 80A, the sheet-type lens 5 of this invention shown in these drawings includes a rectangular dielectric substrate 52 made of a flexible film placed in the x-y plane. The dielectric substrate 52 has a front surface on which a large number of first cut wires 50a each having an elongated rectangular shape are aligned at predetermined intervals in the y-axis direction and the x-axis direction, and a back surface on which a large number of second cut wires 51a each having the same elongated rectangular shape as the first cut wire 50a are aligned so as to overlap the first cut wires 50a, respectively. In this case, the first cut wires 50a and the second cut wires 51a extend lengthwise in a direction parallel to the x axis and are arranged in a matrix to be parallel to each other.

A large number of rectangular first cut wires 50a extending in an elongated shape in the x-axis direction and having a length l are formed to be arranged on the front surface of the dielectric substrate 52 in such a manner that the first cut wires 50a are aligned in the x-axis direction with a gap g therebetween and with the respective center axes agreeing with each other, and are aligned to be parallel to each other in the y-axis direction with space s therebetween. A large number of elongated rectangular second cut wires 51a having the length l are formed on the back surface of the dielectric substrate 52 so as to overlap the first cut wires 50a in such a manner that the second cut wires 51a are aligned in the x-axis direction with the gap g therebetween and with the respective center axes agreeing with each other, and are aligned to be parallel to each other in the y-axis direction with the space s therebetween. The rectangular dielectric substrate 52 has a breadth a and a height b. For example, the dielectric substrate 52 is made of a cycloolefin polymer film having a relative permittivity of about 2.34 and low-loss characteristics expressed by tan δ of about 0.0016. The dielectric substrate 52 may be a different low-loss dielectric film.

The sheet-type lens 5 according to this invention having the above-described configuration is equivalent to a configuration with a large number of unit cells 53 shown in FIG. 82 arranged at predetermined intervals in a matrix. As shown in FIG. 82, the first cut wire 50a and the second cut wire 51a each have a width w and a length l. In the unit cell 53, the rectangular dielectric substrate 52 has a breadth determined by adding the space s to the width w, a vertical length determined by adding the gap g to the length l, and a thickness d. The first cut wire 50a and the second cut wire 51a are each formed, for example, by etching a metallic film formed on the dielectric substrate 52 to a thickness t.

The unit cell 53 is arranged in the x-y plane and surrounded by a periodic boundary wall 54, as shown in FIG. 82. An incident wave In in a terahertz wave band polarized in the y-axis direction enters through the periodic boundary wall 54. A reflected component of the incident wave In becomes a reflected wave Re and a transmitted component of the incident wave In becomes a transmitted wave Tr. The incident wave In has an electric field component E acting in the y-axis direction and a magnetic field component H acting in the x-axis direction. The incident wave In travels in a direction k agreeing with the z-axis direction. Then, as described above about the sheet-type metamaterial 1 shown in FIG. 1, a resonant frequency determined based on the length l of the first cut wire 50a and the second cut wire 51a or a frequency higher than the resonant frequency generates a frequency band where an equivalent permeability takes a negative value. Further, a resonant frequency determined based on the length l of the first cut wire 50a and the second cut wire 51a or a frequency higher than the resonant frequency generates a frequency band where an equivalent permittivity takes a negative value. In this way, the unit cell 53 is given a high refractive index. Metal having favorable conductivity such as gold, silver, copper, or aluminum is applicable as a metallic material for forming the first cut wires 50a and the second cut wires 51a.

FIG. 81B shows exemplary dimensions of the unit cell 53 with a design frequency set at 0.31 THz. According to the exemplary dimensions of the unit cell 53 shown in this drawing, the width w of the first cut wire 50a and the second cut wire 51a is set at about 50 μm, the space s between the first cut wires 50a and between the second cut wires 51a in the y-axis direction at about 160 μm, the thickness t of the first cut wire 50a and the second cut wire 51a at about 0.5 μm, and the thickness d of the dielectric substrate 52 at about 50 μm.

Figure 83:
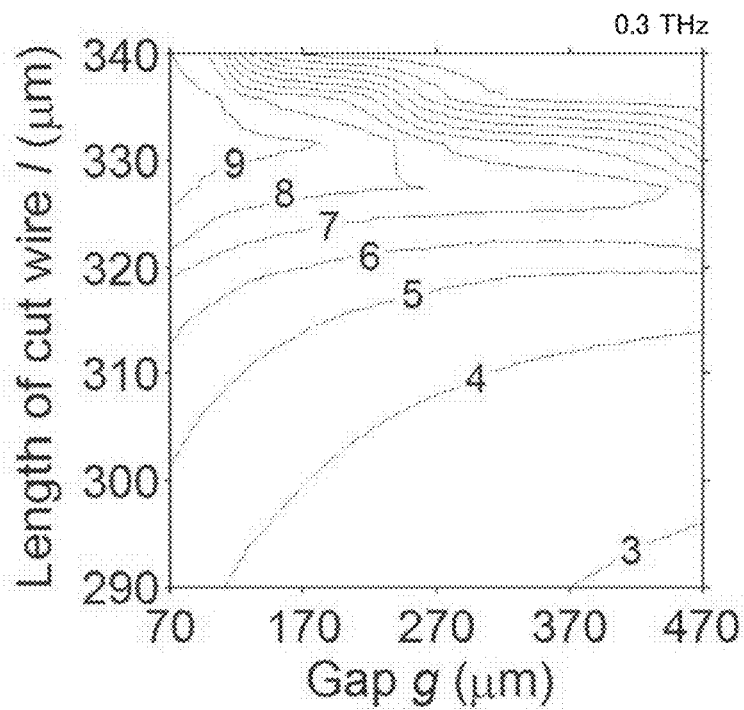
FIG. 83 is a contour chart of a refractive index at 0.3 THz with parameters including the gap g and the length l about the unit cell in the sheet-type lens according to this invention.
Figure 84:
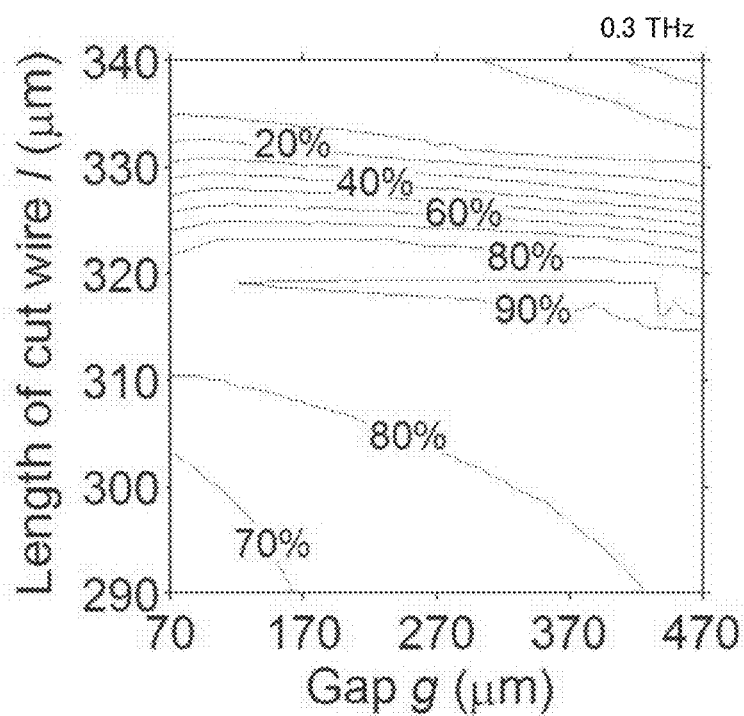
FIG. 84 is a contour chart of transmission power at 0.3 THz with parameters including the gap g and the length l about the unit cell in the sheet-type lens according to this invention.

FIGS. 83 and 84 show analysis results obtained about the electrical characteristics of the unit cell 53 having the above-described dimensions in the sheet-type lens 5 according to this invention.

FIG. 83 is a contour chart of a refractive index at a frequency of 0.3 THz with the gap g (Gap) between the first cut wires 50a and between the second cut wires 51a in the x-axis direction set in a range from 70 to 470 μm, and the length l (Length of cut wire) of the first cut wire 50a and the second cut wire 51a in a range from 290 to 340 μm in the unit cell 53 having the dimensions shown in FIG. 81B. By referring to FIG. 83, the refractive index tends to increase from three to nine with increase in the length l from 290 to about 340 μm. In particular, setting the length l at a value around 330 μm is found to be capable of obtaining a high refractive index throughout the above-described range of the gap g.

FIG. 84 is a contour chart of transmission power at a frequency of 0.3 THz with the gap g (Gap) between the first cut wires 50a and between the second cut wires 51a in the x-axis direction set in a range from 70 to 470 μm, and the length l (Length of cut wire) of the first cut wire 50a and the second cut wire 51a in a range from 290 to 340 μm in the unit cell 53 having the dimensions shown in FIG. 81B. By referring to FIG. 84, setting the length l in a range from about 310 to about 320 μm is found to be capable of obtaining transmission power of about 80% or more throughout the above-described range of the gap g.

By referring to the analysis results given in FIGS. 83 and 84, a high refractive index and high transmission power are obtained if the length l of the first cut wire 50a and the second cut wire 51a is around a length that generates resonance at a design frequency of 0.3 THz. The analysis results show that differing the length l from the length of resonance reduces a refractive index, and that making the length l shorter than the length of resonance reduces a refractive index slowly. The sheet-type lens 5 of this invention is realized by setting the refractive indexes of a large number of unit cells 53 formed at the dielectric substrate 52 in such a manner that the refractive index of the unit cell 53 is reduced with an increasing distance from a center toward a periphery. Specifically, regarding the refractive indexes of the unit cells 53 formed of the first cut wires 50a and the second cut wires 51a on the front surface and the back surface of the dielectric substrate 52 in regions from a first region $R_1$ to a fourth region $R_4$, the unit cell 53 in the first region $R_1$ has the highest refractive index, the unit cell 53 in the second region $R_2$ has the second highest refractive index, the unit cell 53 in the third region $R_3$ has the third highest refractive index, and the unit cell 53 in the fourth region $R_4$ has the lowest refractive index, which is described in detail below.

As shown in FIG. 80A, the dielectric substrate 52 is divided into the horizontally-long first region $R_1$ at a central part of the dielectric substrate 52, the rectangular ring-shaped second region $R_2$ surrounding the outer side of the first region $R_1$, the rectangular ring-shaped third region $R_3$ surrounding the outer side of the second region $R_2$, and the rectangular ring-shaped fourth region $R_4$ surrounding the outer side of the third region $R_3$. As shown in the enlarged view of the one-quarter model in FIG. 80B, in the first region $R_1$, the unit cell 53 has a refractive index $n_1$, the length of the first cut wire 50a and the second cut wire 51a is $l_1$, and a gap between the first cut wires 50a and between the second cut wires 51a in the x-axis direction is $g_1$. In the second region $R_2$, the refractive index is $n_2$, the length is $l_2$, and the gap is $g_2$. In the third region $R_3$, the refractive index is $n_3$, the length is $l_3$, and the gap is $g_3$. In the fourth region $R_4$, the refractive index is $n_4$, the length is $l_4$, and the gap is $g_4$. FIG. 81A shows exemplary numerical values of the refractive indexes $n_1$ to $n_4$, those of the lengths $l_1$ to $l_4$, and those of the gaps $g_1$ to $g_4$ designed so as to obtain a focusing length of 10 mm in the sheet-type lens 5. In FIG. 81A, $P_1$ shows transmission power in the unit cell 53 in the first region $R_1$. Likewise, $P_2$ to $P_4$ show respective transmission powers in the second region $R_2$ to the fourth region $R_4$.

As described above, the required refractive indexes $n_1$ to $n_4$ shown in FIG. 83 can be obtained by setting the lengths $l_1$ to $l_4$ of the first cut wire 50a and the second cut wire 51 and setting the gaps $g_1$ to $g_4$ between the first cut wires 50a and between the second cut wires 51a in the x-axis direction at the dimensions shown in FIG. 81A.

Figure 85:
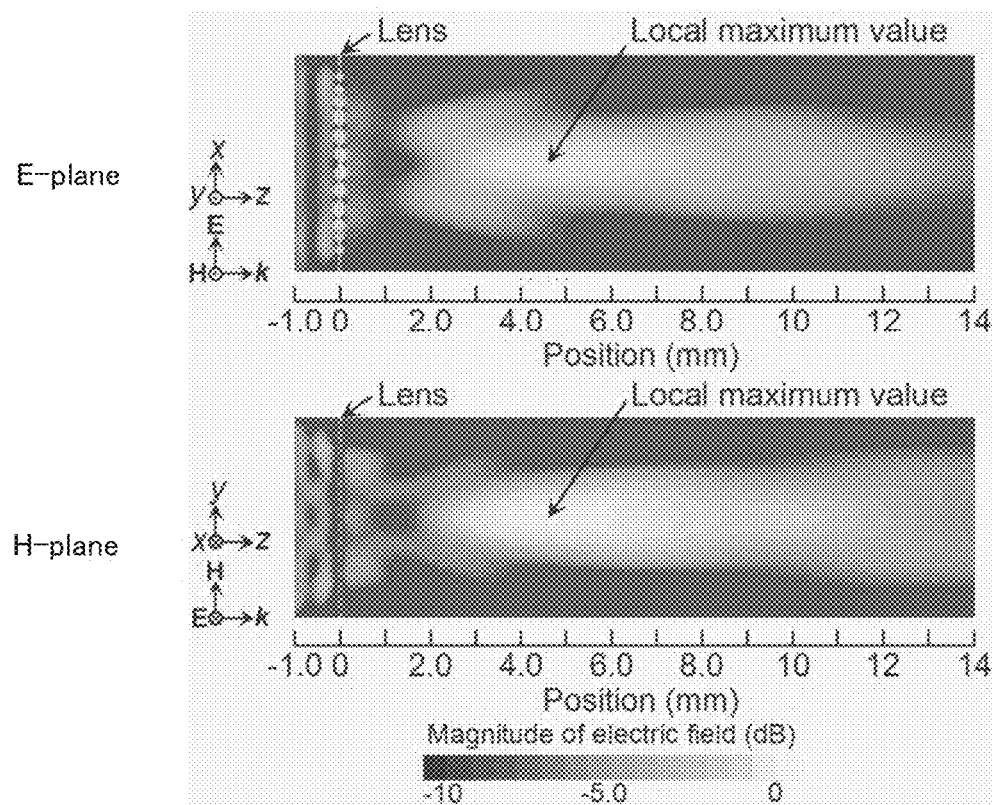
FIG. 85 shows a distribution of the magnitude of electric field in an E-plane and a corresponding distribution in an H-plane of the sheet-type lens according to the embodiment of this invention.

FIG. 85 shows a distribution of the magnitude of electric field in an E-plane (E-plane) and a corresponding distribution in an H-plane (H-plane) of the sheet-type lens 5 of this invention obtained by employing the numerical values and the dimensions shown in FIGS. 81A and 81B.

By referring to the distribution of the magnitude of electric field in the E-plane (E-plane) shown in FIG. 85, a horizontal axis shows a position (Position) on an optical axis (z axis) from the sheet-type lens 5 (lens). A position in the E-plane separated by a distance exceeding about 4 mm from the sheet-type lens 5 is found to be a position where the magnitude of electric field is at a maximum. By referring to the distribution of the magnitude of electric field in the H-plane (H-plane) shown in FIG. 85, a horizontal axis shows a position (Position) on the optical axis from the sheet-type lens 5 (lens). A position in the H-plane separated by a distance exceeding about 4 mm from the sheet-type lens 5 is found to be a position where the magnitude of electric field is at a maximum.

Figure 86:
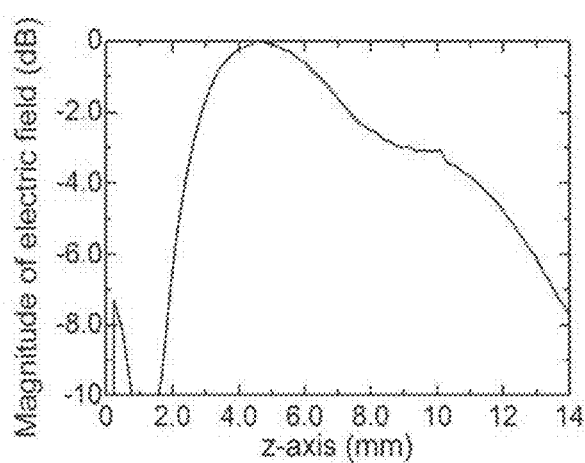
FIG. 86 shows the magnitude of electric field on an optical axis of the sheet-type lens according to the embodiment of this invention.

FIG. 86 shows the magnitude of electric field on the optical axis (z-axis) of the sheet-type lens 5 of this invention obtained by employing the numerical values and the dimensions shown in FIGS. 81A and 81B.

By referring to FIG. 86, a horizontal axis shows a distance on the optical axis (z-axis) from the sheet-type lens 5 (lens), a vertical axis shows the magnitude of electric field, and a maximum is normalized (0 dB). If the distance from the sheet-type lens 5 exceeds about 1.5 mm, the magnitude of electric field exceeds −10 dB and increases steeply to a maximum (0 dB) at a position of about 4.5 mm. If a distance exceeds about 4.5 mm, the magnitude of electric field is found to decrease slowly in response to the distance. The magnitude of electric field is about −7.8 dB at a position where the distance is 14 mm.

Figure 87:
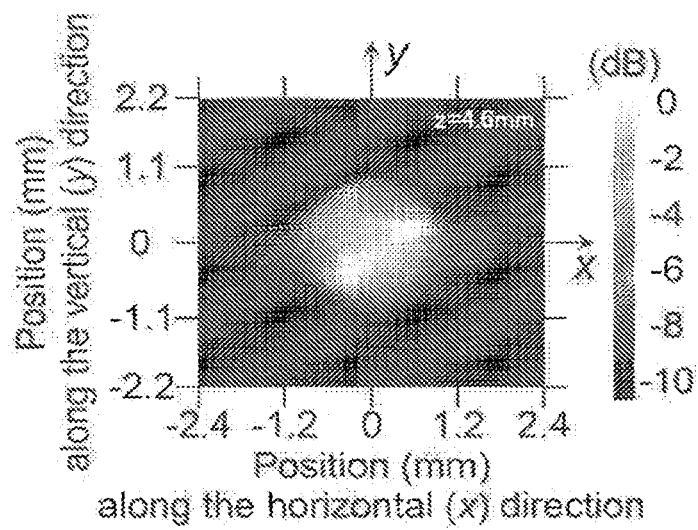
FIG. 87 shows a distribution of the magnitude of electric field in a plane perpendicular to the optical axis of the sheet-type lens according to the embodiment of this invention.
Figure 88:
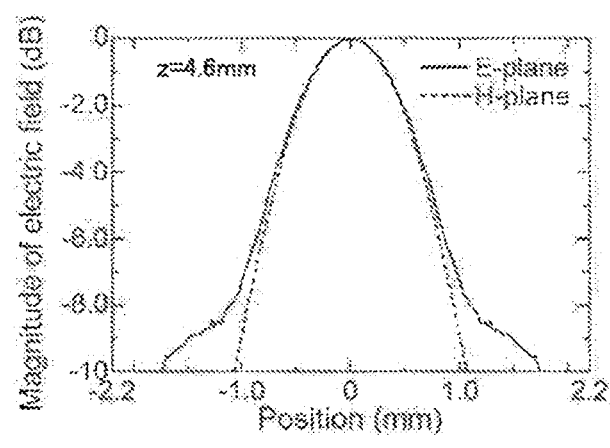
FIG. 88 shows the magnitude of electric field in the plane perpendicular to the optical axis of the sheet-type lens according to the embodiment of this invention relative to a distance at the plane perpendicular to the optical axis.
Figure 89:
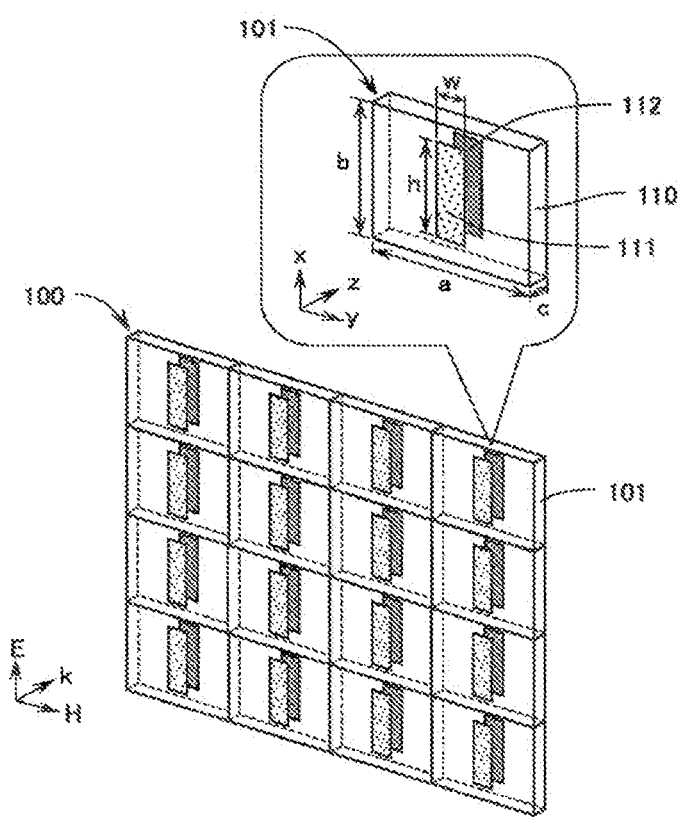
FIG. 89 is a perspective view showing the configuration of a conventional sheet-type metamaterial and a perspective view partially showing the configuration of the conventional sheet-type metamaterial in an enlarged manner.

FIG. 87 shows a distribution of the magnitude of electric field in a plane centered on the optical axis (z axis) of the sheet-type lens 5 of this invention obtained by employing the numerical values and the dimensions shown in FIGS. 81A and 81B. FIG. 88 shows the magnitude of electric field in the plane centered on the optical axis of the sheet-type lens 5 of this invention relative to a distance from the center obtained by employing the numerical values and the dimensions shown in FIGS. 81A and 81B.

FIG. 87 shows a distribution of the magnitude of electric field in the plane centered on the optical axis obtained at a position on the optical axis (z axis) where a distance from the sheet-type lens 5 (lens) is 4.6 mm. By referring to FIG. 87, the magnitude of electric field is found to be at a maximum at a position of 0 mm on the vertical axis where a vertical position is at the center, and at a position of 0 mm on the horizontal axis where a horizontal position is at the center.

FIG. 88 shows a distribution of the magnitude of electric field in the E-plane (E-plane) and a corresponding distribution in the H-plane (H-plane), both in the plane centered on the optical axis obtained at a position on the optical axis (z axis) where a distance from the sheet-type lens 5 (lens) is 4.6 mm. The magnitude of electric field is normalized (0 dB) at a position (Position) of 0 mm corresponding to a center position. By referring to FIG. 88, the magnitude of electric field in the E-plane (E-plane) indicated by a solid line is at a maximum (0 dB) at a positon (Position) of 0 mm corresponding to a center position. The magnitude of electric field is reduced with increase in a distance from the position of 0 mm to about −3 dB at positions of about plus and minus 0.6 mm and to about −10 dB at positions of about plus and minus 1.7 mm. The magnitude of electric field in the H-plane (H-plane) indicated by a dashed line is at a maximum (0 dB) at a positon (Position) of 0 mm corresponding to a center position. The magnitude of electric field is reduced with increase in a distance from the position of 0 mm to about −3 dB at positions of about plus and minus 0.55 mm and to about −10 dB at positions of about plus and minus 1.1 mm.

In the above-described sheet-type lens 5 of this invention, the depth of focus is about 6.3 mm. Further, at a position on the optical axis (z axis) where a distance from the sheet-type lens 5 (lens) is 4.6 mm, flux of a terahertz wave has a half width of 1.2 mm in the E-plane and 1.1 mm in the H-plane.

The sheet-type lens 5 of this invention shown in FIGS. 80A and 80B is divided into the four regions from the region $R_1$ to the region $R_4$. However, these are not the only divided regions but the sheet-type lens 5 may be divided into n regions. In this case, each region except an innermost region and an outermost region surrounds a region inside this region and is surrounded by a region external to this region. Further, a refractive index is reduced with an increasing distance from an inner region toward an outer region.

INDUSTRIAL APPLICABILITY

In the above-described sheet-type metamaterial of this invention, a high refractive index and favorable transmission power can be obtained by setting the length l of the first cut wire and the second cut wire at a length approximate to a value to generate resonance at a design frequency. For example, a half wave on the dielectric substrate at 0.3 THz is about 327 µm and a half wave on the dielectric substrate at 0.5 THz is about 196 µm. A refractive index of 8 or more and transmission power of 80% or more can be obtained by reducing the thickness of the dielectric substrate.

In the sheet-type metamaterial according to this invention, the dielectric substrate is not limited to a cycloolefin polymer film, as long as the dielectric substrate has low-loss characteristics. Changing the relative permittivity of the dielectric substrate changes a wavelength shortening ratio at the dielectric substrate. Thus, the length l of the first cut wire and the second cut wire is determined in response to the wavelength shortening ratio. The dielectric substrate made of a cycloolefin polymer film has a relative permittivity of about 2.34, so that a wavelength shortening ratio at the dielectric substrate becomes about 0.654. A metallic material used for forming the first cut wire and the second cut wire is not limited to gold, silver, copper, or aluminum. A metallic material of low resistance loss is preferred.

The sheet-type metamaterial of this invention includes: the elongated metallic first cut wires of the predetermined length l aligned on the front surface of the dielectric substrate of the thickness d in the y-axis direction and in the x-axis direction perpendicular to the y-axis with the space s therebetween; and the second cut wires having the same shape as the first cut wires aligned on the back surface of the dielectric substrate so as to overlap the first cut wires.

A refractive index of five or more can be obtained by setting a usable frequency in a range from 0.3 to 0.5 THz, the width w of the first cut wire and the second cut wire in a range from about 46 to about 50 µm, the space s in a range from about 160 to about 162 µm, and the thickness d at about 50 µm. In this case, a refractive index of about eight or more can be obtained by setting the thickness d at about 23 µm while the other dimensions are unchanged. A higher refractive index can be obtained by reducing the thickness d.

A refractive index of three or more can be obtained by setting a usable frequency in a range from 0.6 to 0.9 THz, the width w of the first cut wire and the second cut wire at about 46 µm, the space s at about 162 µm, and the thickness d at about 50 µm. In this case, a refractive index of about six or more can be obtained by setting the thickness d at about 23 µm while the other dimensions are unchanged. A higher refractive index can be obtained by reducing the thickness d.

A refractive index of 0.5 or more can be obtained by setting a usable frequency in a range from 1.0 to 3.0 THz, reducing the width w of the first cut wire and the second cut wire (from about 5 to about 46 µm) with frequency increase, reducing the space s (from about 16 to about 162 µm) with frequency increase, and setting the thickness d at about 50 µm. In this case, a refractive index of about two or more can be obtained by setting the thickness d at about 23 µm while the other dimensions are unchanged. A higher refractive index can be obtained by reducing the thickness d.

REFERENCE SIGNS LIST

1 Sheet-type metamaterial
5 Sheet-type lens
10 First wire array

10a First cut wire
11 Second wire array
11a Second cut wire
12 Dielectric substrate
13 Unit cell
14 Periodic boundary wall
50a First cut wire
51a Second cut wire
52 Dielectric substrate
53 Unit cell
54 Periodic boundary wall
100 Sheet-type metamaterial
101 Unit cell
111 Front surface metal strip
112 Back surface metal strip
In Incident wave
Re Reflected wave
Tr Transmitted wave
$R_1$ First region
$R_2$ Second region
$R_3$ Third region
$R_4$ Fourth region

The invention claimed is:

1. A sheet-type metamaterial to operate in a terahertz wave band, comprising:
a film-shaped dielectric substrate;
a first wire array formed on one surface of the dielectric substrate; and
a second wire array formed on an opposite surface of the dielectric substrate, wherein
the first wire array includes elongated metallic first cut wires of a predetermined length l aligned in a direction of a y-axis of the dielectric substrate with a gap g therebetween and in an x-axis direction perpendicular to the y-axis with space s therebetween,
the second wire array includes second metallic cut wires having a same shape and length l as the first cut wires and aligned so as to overlap the first cut wires,
the length l of each of the first cut wires and the second cut wires is set in a range from about 20 to about 320 μm, and
with a wavelength λ at a usable frequency, the length l of the first cut wires and the second cut wires is about λ/2.

2. The sheet-type metamaterial according to claim 1, wherein
with a design frequency set in a range from 1.0 to 3.0 THz, a higher refractive index is obtained by reducing the space s from about 46 μm to about 5 μm with a frequency increase and by reducing a thickness d of the dielectric substrate from about 50 μm to about 23 μm.

3. The sheet-type metamaterial according to claim 1, wherein
with a design frequency set in a range from 0.3 to 0.9 THz, a higher refractive index is obtained by setting the space s at about 160 μm and reducing a thickness d of the dielectric substrate from about 50 μm to about 23 μm.

4. A sheet-type lens comprising a plurality of unit cells aligned on a film-shaped dielectric substrate, wherein
the unit cells each include an elongated metallic first cut wire of a predetermined length l formed on one surface of the dielectric substrate, and a second metallic cut wire having a same shape as the first cut wire and formed on an opposite surface of the dielectric substrate so as to overlap the first cut wire,
the first cut wires of the unit cells are aligned on the one surface of the dielectric substrate in an x-axis direction with a gap g therebetween and in a y-axis direction perpendicular to the x-axis direction with space s therebetween,
the second cut wires of the unit cells are aligned on the opposite surface of the dielectric substrate in the x-axis direction with the gap g therebetween and in the y-axis direction perpendicular to the x-axis direction with the space s therebetween,
the first cut wire and the second cut wire each have a long axis extending substantially parallel to the x-axis direction,
the dielectric substrate has a region divided into n regions from a central part to an outer edge of the dielectric substrate,
each region except an innermost region and an outermost region surrounds a region inside this region and is surrounded by a region external to this region, and
a refractive index is reduced with an increasing distance from an inner region toward an outer region.

5. The sheet-type lens according to claim 4, wherein the second cut wire has a same length l as the first cut wire, and with a thickness d of the dielectric substrate set at about 50 μm, the length l of each of the first cut wire and the second cut wire is a length approximate to a value to generate resonance at a design frequency.

6. The sheet-type lens according to claim 4, wherein
the refractive index is reduced with the increasing distance from the inner region toward the outer region by increasing the gap g with an increasing distance from the inner region toward the outer region.

* * * * *